United States Patent

Nagano

[11] Patent Number: 6,159,856
[45] Date of Patent: Dec. 12, 2000

[54] METHOD OF MANUFACTURING A SEMICONDUCTOR DEVICE WITH A SILICIDE LAYER

[75] Inventor: Takashi Nagano, Kanagawa, Japan

[73] Assignee: Sony Corporation, Tokyo, Japan

[21] Appl. No.: 08/993,865

[22] Filed: Dec. 18, 1997

[30] Foreign Application Priority Data

Dec. 26, 1996 [JP] Japan .................................. 8-348811
Dec. 26, 1996 [JP] Japan .................................. 8-348817
Aug. 7, 1997 [JP] Japan .................................. 9-213718

[51] Int. Cl.$^7$ .................................................. H01L 21/44
[52] U.S. Cl. .......................... 438/683; 438/680; 438/682; 438/766
[58] Field of Search .................... 438/522, 533, 438/541, 558, 659, 680, 682, 683, 766

[56] References Cited

U.S. PATENT DOCUMENTS 4,558,507  12/1985  Okabayashi et al. .................. 438/659
5,217,923   6/1993  Suguro ..................................... 438/586

*Primary Examiner*—David Nelms
*Assistant Examiner*—Reneé R. Berry
*Attorney, Agent, or Firm*—Sonnenschein, Nath & Rosenthal

[57] ABSTRACT

A refractory metal film such as a cobalt (Co) film of 10 nm in thickness is formed on a silicon substrate. Ion implantation of silicon ions is then performed through the cobalt film with energy of 10 keV and a dose of $3\times10^{16}/cm^2$. Through the silicon ion implantation, silicon atoms are implanted in the cobalt film while crystal damage is produced in silicon crystal at a cobalt/silicon interface. The crystal damage allows silicon atoms consumed for a silicidation reaction for forming a cobalt silicide film to exist as atoms not forming a crystal. Activation energy for the silicidation reaction is thus reduced. The reaction for silicidation is completed in a short time. As a result, a reduction in thickness of the cobalt film due to surface oxidation is suppressed. A thick cobalt silicide film is formed as well without reducing the amount of cobalt consumed for silicidation. Sheet resistance of the cobalt silicide film is thus reduced.

23 Claims, 17 Drawing Sheets

METHOD OF MANUFACTURING A SEMICONDUCTOR DEVICE WITH A SILICIDE LAYER

BACKGROUND OF THE INVENTION

1. Field of the Invention

The present invention relates to a method of manufacturing a semiconductor device having a refractory metal silicide layer on a semiconductor substrate made of a silicon material.

2. Description of the Related Art

A high degree of microstructuring has been pursued for a metal oxide semiconductor (MOS) field effect transistor (referred to as a MOS transistor in the following description) in accordance with scaling rules of semiconductor fabrication. A gate wiring width has been reduced, accordingly. With reduced gate wiring width, however, a short-channel effect increases and source and drain withstand voltage is reduced. Shallow impurity layers (source and drain regions) are effective for suppressing the short-channel effect and avoiding source and drain withstand voltage degradation. Formation of shallower impurity layers is desired. However, a sheet resistance of the source and drain regions increases as the regions become shallower. As a result, current drivability of the MOS transistor is reduced. That is, a response speed of the MOS transistor is reduced.

In order to overcome the problem, excimer laser annealing, for example, has been introduced wherein excimer laser is applied as heat treatment after ion implantation for forming source and drain regions. Excimer laser annealing is suitable for forming a shallow junction because only a shallow part of a surface of a substrate is heated in a short time with an application of excimer laser. In addition, excimer laser annealing allows the substrate to be heated to a high temperature. As a result, excellent crystallinity of the impurity layers is achieved, compared to rapid thermal processing (RTP). Source and drain regions with lower resistivity are thus formed. However, excimer laser annealing is still not sufficient for lower resistivity fabrication since a junction depth in the source and drain regions is contrary to a resistivity in each of the regions.

As another method of achieving a lower source and drain resistivity, a 'salicide' (self-aligned silicide) process is disclosed in Chin-Yuan Lu, Janmye James Sung, Ruichen Liu, Nun-Sian Tsai, Ranbir Singh, Steaven J. Hillenius and Howard C. Kirsch, IEEE Transactions on Electron Device, vol. 38, no. 2, February 1991, pp.246–253. In the salicide process a metal silicide layer of a refractory metal such as a titanium silicide ($TiSi_2$) layer is formed in a surface of an impurity layer. The salicide process, however, does not allow formation of shallower source and drain regions since current leakage must be avoided between the titanium silicide layer and a semiconductor substrate. If a shallower impurity layer is formed, the titanium silicide layer goes through the impurity layer to the semiconductor substrate. Therefore the salicide process is accompanied with the problem of current leakage between the titanium silicide layer and the semiconductor substrate while a lower resistivity of source and drain regions is achieved. It is thus required to form an impurity layer deep enough for preventing the titanium silicide layer from penetrating the impurity layer. As described so far, each of the excimer laser annealing and the salicide process has its merits and demerits for achieving a lower resistivity of source and drain regions.

In order to form a titanium silicide layer which is satisfactorily thin but does not penetrate an impurity layer of shallow source and drain regions, a method has been introduced to form a thin film of titanium (Ti) of 20 nm or less over an impurity layer to be reacted with a silicon substrate so as to form the thin film of titanium silicide. However, a layer of lower resistivity is hard to achieve with higher activation energy when forming the thin film of titanium into titanium silicide as described in Nikkei Microdevice ed., Technological White Paper of Low Power LSI: A Challenge to 1 Milliwatt, pp. 218–222. Heat treatment under a higher temperature is required for obtaining a thin film of titanium silicide with a low resistivity. However, titanium silicide coheres due to the high temperature heat treatment, which prevents formation of a titanium silicide layer of a low resistivity.

An application of a cobalt silicide ($CoSi_2$) layer has been proposed as a refractory metal silicide layer without cohesion as described in, for example, K Goto et al., IEDM '95 (Tech Dig.) pp. 449–452. In this method, too, it is desired to reduce current leakage by suppressing a spike locally growing in a cobalt silicide layer. A spike growth in a cobalt silicide layer is frequently seen when the cobalt silicide layer is formed through a layered film (TiN-Co). In contrast, a spike growth is hardly seen when the cobalt silicide layer is formed through a single layer of cobalt (Co). However, a cobalt silicide layer of lower resistivity cannot be obtained through a single layer of cobalt.

As described so far, a junction in an impurity region is required to be much shallower due to microstructuring of a device, which is accompanied with a much thinner silicide film. Therefore the problems described above are commonly found in conventional device structures.

SUMMARY OF THE INVENTION

The present invention is designed to overcome the problems described above. It is an objective of the invention to provide a method of manufacturing a semiconductor device with a silicide layer without current leakage even with advanced microstructuring of device elements. Sheet resistance reduction is also achieved in a shallow impurity layer. A response of the device elements is improved as well.

A method of manufacturing a semiconductor device of the invention includes steps of forming a refractory metal layer on a surface of a semiconductor substrate made of silicon; producing crystal damage in a region at an interface between the refractory metal layer and the semiconductor substrate by ion implantation of atoms or molecules through the refractory metal layer; and forming a refractory metal silicide layer through a heat treatment for silicidation of the refractory metal layer, that is, for producing a reaction of the refractory metal layer to form refractory metal silicide.

Implanted ions are preferably silicon ions ($Si^+$). Ionized atoms, such as boron, having an effect of suppressing enhanced diffusion may be used as well. Alternatively, ions containing atoms having an effect of suppressing enhanced diffusion may be used, such as silicon fluoride ions ($SiF^+$) and fluoride ions ($F^+$).

In order to accelerate a reaction for silicidation, the invention allows a sum of vacancies and interstitial atoms per unit area produced by ion implantation to be equal to or more of an amount of silicon atoms per unit area consumed for silicidation of the refractory metal layer. When silicon ions are implanted, in particular, it is preferred that a sum of silicon atoms implanted by ion implantation and vacancies and interstitial atoms per unit area produced by the ion implantation are each equal to or greater than an amount of silicon atoms per unit area consumed for silicidation of the refractory metal layer.

According to the method of manufacturing a semiconductor device of the invention, the refractory metal film is formed in the surface of the semiconductor substrate (silicon substrate) followed by ion implantation of silicon ions, for example. Crystal damage is thus produced in the region at the interface between the refractory metal film and the semiconductor substrate. Consequently a reaction is easily achieved between the refractory metal and silicon to complete the reaction for silicidation in a short time. As a result, a reduction in thickness of the refractory metal film due to surface oxidation is suppressed. A thick refractory metal silicide layer is formed without reducing the amount of refractory metal consumed for silicidation. The refractory metal silicide layer of low sheet resistance is achieved.

BRIEF DESCRIPTION OF THE DRAWINGS

FIG. 2(A) is a cross section showing an ion implantation process into a cobalt film. FIG. 2(B) is a cross section showing crystal damage after the ion implantation.

FIG. 5(A) is a cross section showing cobalt or cobalt silicide remaining unreacted in grain boundaries. FIG. 5(B) is a cross section showing a state of improved with cobalt or cobalt silicide rereacted.

FIG. 6(A) is a cross section showing an ion implantation process into a cobalt layer. FIG. 6(B) is a cross section showing crystal damage after the ion implantation.

DESCRIPTION OF THE PREFERRED EMBODIMENT

Preferred embodiments of the present invention will now be described in detail with reference to the accompanying drawings.

A fundamental principle of the invention will be described before detailed description of preferred embodiments. The invention provides stable formation of a very thin film of refractory metal silicide over a shallow impurity layer in each of source and drain regions without increasing current leakage. A refractory metal silicide layer of low resistivity is formed over a gate electrode with a width of 0.1 μm or less as well.

Figure 2:
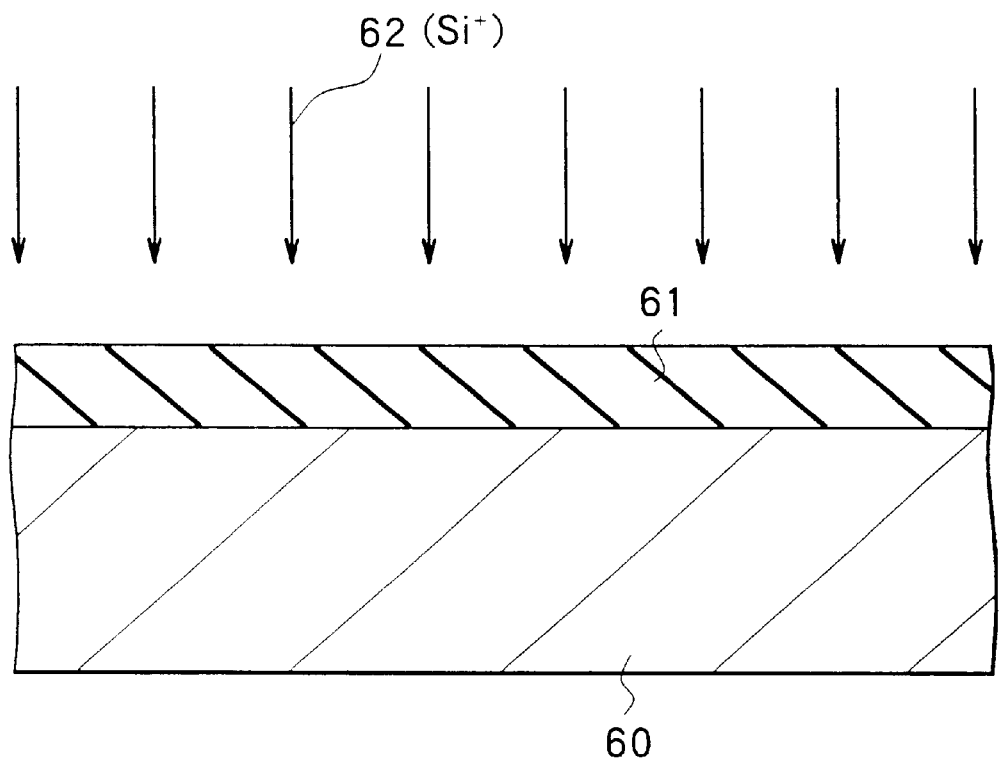
FIGS. 2(A) and 2(B) are schematics for illustrating a fundamental principle of the invention.
Figure 2:
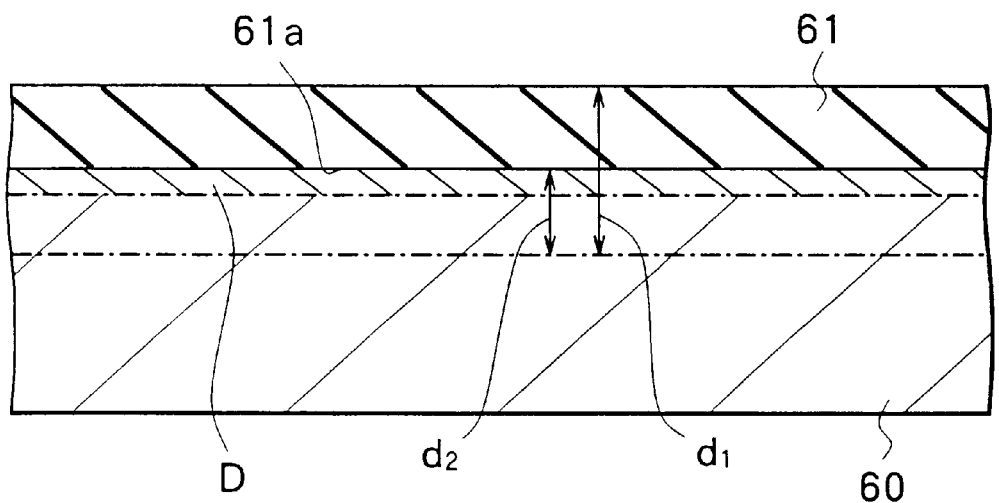

FIGS. 2(A) and 2(B) each show a cross section of a substrate for illustrating a step of cobalt silicide layer formation. As shown in FIG. 2(A), a refractory metal layer is first formed on a silicon substrate 60 through sputtering, for example. The refractory metal layer is, for example, a cobalt film 61 having a thickness of 10 nm. Ion implantation of silicon ions 62 is then performed over the cobalt film 61 with implantation energy of 10 keV and a dose of $3 \times 10^{16}/cm^2$. FIG. 2(B) shows crystal damage in the silicon substrate 60 after the silicon ion implantation. Through the implantation of the silicon ions 62, silicon crystal is damaged at a cobalt/silicon interface 61a as well as silicon atoms are implanted in the cobalt film 61. Ion implantation energy is decided in accordance with an atomic weight or a molecular weight of an atom or a molecule to be implanted. That is, ion implantation energy required is N keV or less for an atom or a molecule whose atomic weight or molecular weight is N. For example, implantation energy required for silicon ions is 28 keV or less for a silicon atom whose atomic weight is 28. In particular, crystal damage in the silicon substrate 60 is effectively produced in a region 40 nm or less below the cobalt/silicon interface 61a with ion implantation energy of 20 keV or less or preferably of the order of 10 keV. As a result, a cobalt silicide layer of low resistivity without a nanowire effect is obtained. In addition, current leakage at a junction (junction leakage) due to crystal defects is suppressed with ion implantation energy of 20 keV or less.

A mechanism of forming a cobalt silicide layer of low resistivity without a nanowire effect will be further described in detail. Ion implantation of silicon atoms in the cobalt film 61 causes crystal damage in the silicon substrate 60. Due to the crystal damage, silicon atoms to be consumed by a silicidation reaction for forming a cobalt silicide layer become amorphous. That is, the silicon atoms each exist as an atom not forming a crystal. Activation energy for the silicidation reaction is thus reduced. Therefore it is no more necessary to split bonds of the silicon crystal for the silicidation reaction. The silicidation reaction is thus completed in a short time. As a result, reduction of the thickness of the cobalt film 61 due to surface oxidation is prevented. A thick cobalt silicide layer will be formed as well without reducing the amount of cobalt consumed by the silicidation reaction. Sheet resistance of the cobalt silicide layer is therefore reduced. In addition, silicon crystal damage occurs as well at the cobalt/silicon interface 61a. A natural oxide film is thus destroyed which is grown at the cobalt/silicon interface 61a before the formation of the cobalt film 61. The reaction between cobalt and silicon is therefore easily achieved so as to form cobalt silicide with small crystal grains. Stable growth of a cobalt silicide layer is thus achieved over a gate electrode with a width of 0.1 μm or less with lower resistivity.

Figure 3:
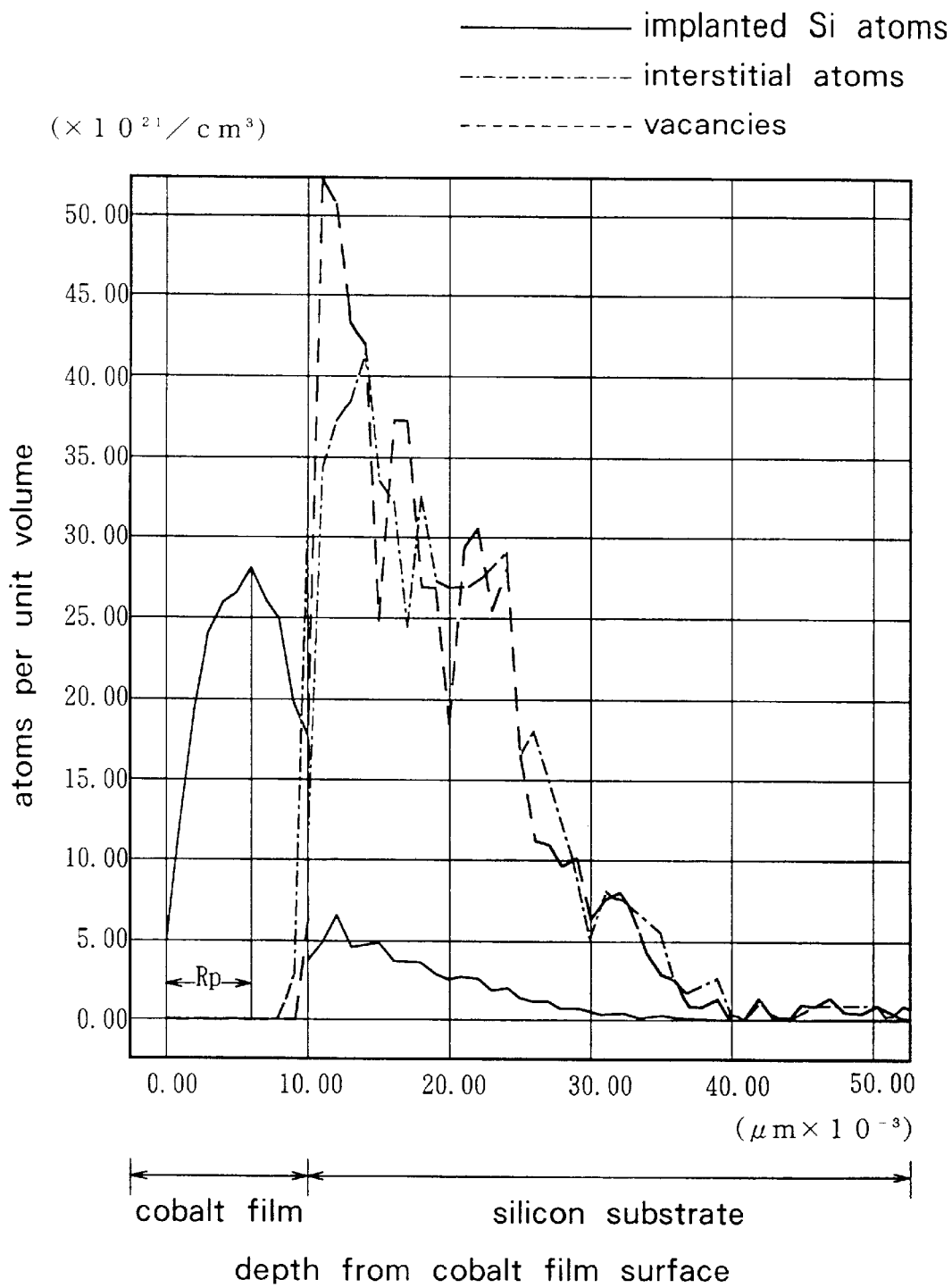
FIG. 3 is a chart for describing crystal damage when ion implantation is performed as shown in FIG. 2(B) in terms of atomicity.

FIG. 3 shows a result of a simulation of silicon ion implantation into a cobalt film from above the cobalt film with a thickness of 10 nm formed on a silicon substrate. A solid line indicates a distribution of implanted silicon atoms. A broken line indicates a distribution of vacancies. A dot-dashed line indicates a distribution of interstitial atoms. The silicon ion implantation is performed with energy of 10 keV and a dose of $3\times10^{16}/cm^2$. The concentration profile of the implanted silicon ions has its peak (Rp) where a depth $d_1$ (see FIG. 2(B)) from the cobalt surface is within 10 nm as shown in the figure by the solid line. The silicon crystal damage results in a complete amorphous in a region D where a depth $d_2$ from the cobalt/silicon interface 61a is 10 nm or less. Within this region the sum of the vacancies and the interstitial atoms is $5\times10^{22}/cm^3$ or more, that is, atoms in silicon crystal per unit volume. Therefore a natural oxide film at the cobalt/silicon interface is satisfactorily destroyed. The sum of the implanted silicon atoms, the vacancies and the interstitial atoms is $1.8\times10^{17}/cm^2$ per unit area where the depth $d_1$ from the cobalt surface is 40 nm or the depth $d_2$ from the cobalt/silicon interface is 30 nm. The sum is equal to silicon atoms per unit area required for silicidation of cobalt of 10 nm completely into cobalt silicide, that is, $1.82\times10^{17}/cm^2$. Therefore activation energy for the silicidation reaction is satisfactorily reduced.

Figure 4:
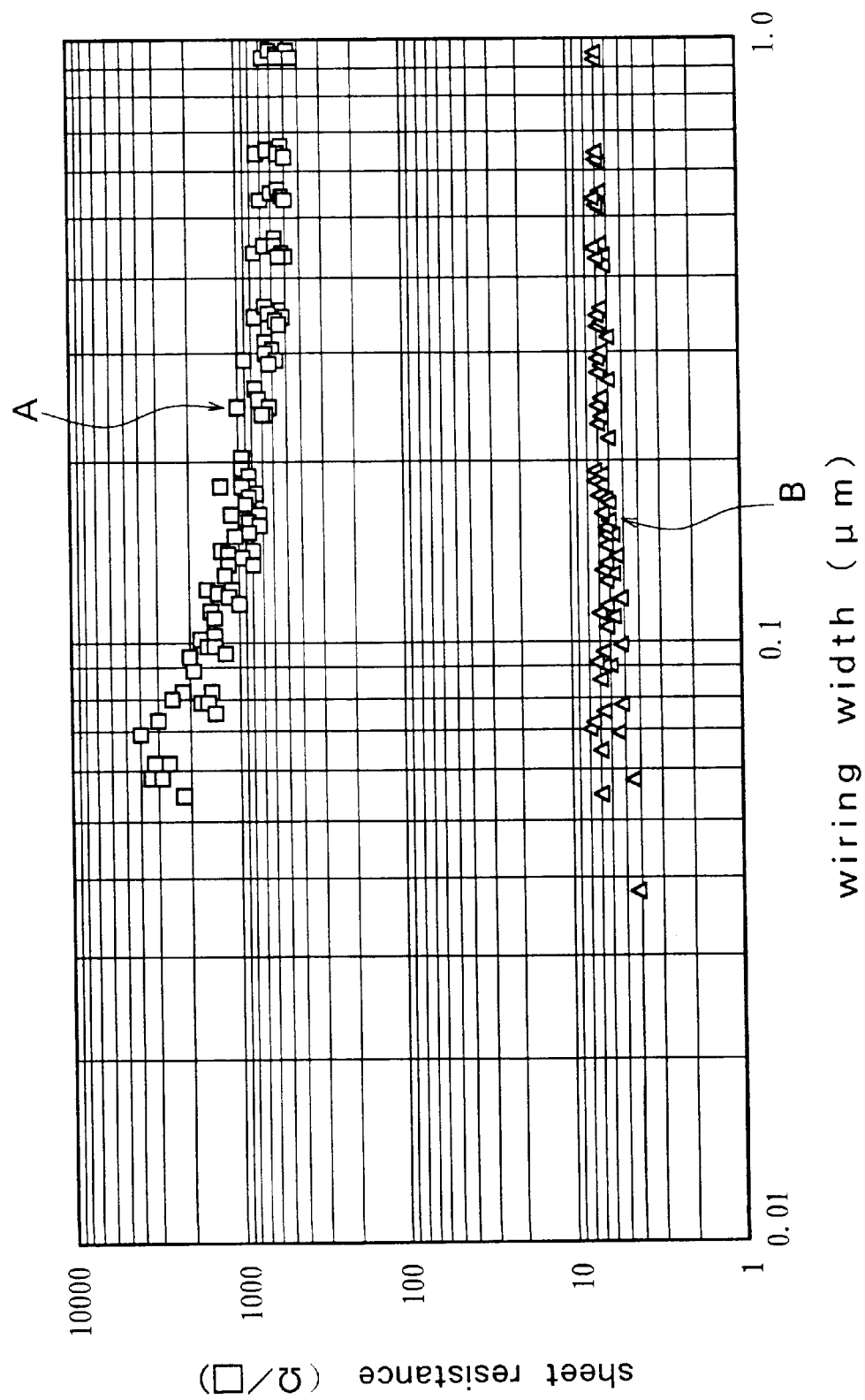
FIG. 4 is a chart for describing a dependence of sheet resistance on a wiring width when ion implantation is performed as shown in FIG. 2(B).

FIG. 4 shows a result of an experiment on a dependence of sheet resistance of a shallow impurity region on a wiring width. Both A and B in the figure indicate a result of silicidation after formation of a cobalt film of 10 nm on a silicon substrate. A is a result without silicon ion implantation. B is a result with silicon ion implantation with energy of 10 keV and a dose of $3\times10^{16}/cm^2$ through a cobalt film after the formation thereof. The silicidation is performed through heating at 550° C. for 30 seconds, followed by heating at 800° C. for 30 seconds. As shown in the figure, a dependence on a wiring width is found in the result without silicon ion implantation (A). A sheet resistance increases when a wiring width is below 0.1 $\mu$m. With silicon ion implantation (B), in contrast, a sheet resistance is 5 to 6 ohm/□ for a cobalt silicide layer of approximately 35 nm in thickness formed from a cobalt film of 10 nm in thickness. This sheet resistance is the same in a range below 0.1 $\mu$m. That is, a dependence on a wiring width is not found with silicon ion implantation.

Besides silicon ions, the foregoing description of the principle applies to ions containing ions resulting from ionized atoms with an enhanced diffusion suppressing effect, such as silicon fluoride ions (SiF$^+$) and fluoride ions (F$^+$) described below.

The present invention utilizes the results described so far for forming a refractory metal silicide layer through a very thin film of refractory metal of 20 nm or less, preferably 10 nm or less, in thickness. Reduced sheet resistance is achieved for the refractory metal silicide layer by implantation of any of silicon ions, silicon fluoride ions and fluoride ions or implantation of silicon ions and fluoride ions at the same time. The sheet resistance does not depend on a wiring width even in a region where a wiring width is 0.1 $\mu$m or less. If the thickness of the refractory metal film exceeds 20 nm, silicidation proceeds deeper into the film, which may cause junction leakage. In contrast, with the thickness of 20 nm or less, the refractory silicide layer is formed in a depth of the order of 70 nm without junction leakage. In addition, a depth of a silicon substrate to be consumed is reduced by formation of the refractory metal silicide layer through the very thin film of refractory metal. The refractory metal silicide layer is thus formed as well on a very shallow impurity region of 0.15 $\mu$m or less.

In order to accelrate the silicidation reaction in the invention, it is required that the sum of the vacancies and the interstitial atoms per unit area formed through ion implantation is equal to or more than silicon atoms per unit area consumed for silicidation of the refractory metal film. In particular, it is preferable for silicon ion implantation that the sum of the implanted silicon atoms, the vacancies and the interstitial atoms per unit area is equal to or more than silicon atoms per unit area consumed for silicidation of the refractory metal film Furthermore, it is preferable in the invention that the crystal damage through ion implantation of atoms or molecules allows the density of the vacancies or the interstitial atoms in a region adjacent to the interface between the refractory metal film and the silicon substrate to be half or more of the number of the atoms per unit volume in the silicon crystal. Alternatively, it is preferable that the crystal damage through ion implantation of atoms or molecules allows all the bonds of the silicon atoms in a region near the interface between the refractory metal film and the silicon substrate to be split. As a result, a natural oxide film at the interface between the refractory metal film and the silicon substrate is destroyed. Crystal grains of the refractory metal silicide to be formed are smaller as well. Stable growth of the refractory metal silicide layer is thus achieved over a wiring with a width of 0.1 $\mu$m or less with lower resistivity.

A preferred dose for ion implantation is $1\times10^{16}/cm^2$ or more in the invention. The crystal damage as described above is achieved with the preferred dose.

Furthermore, implantation energy is controlled such that the peak Rp of the concentration profile of implanted atoms or molecules is in the refractory metal film. As a result, the depth of the crystal damage in the impurity layer is less than 50 nm o r preferably 40 nm or less. Junction leakage due to crystal defects is therefore suppressed when the depth of the impurity layer is 0.15 $\mu$m or less.

First Embodiment

A practical example of the invention will now be described, applied to a manufacturing method of an n-channel MOS transistor. The n-channel MOS transistor comprises source and drain regions as an impurity layer of 0.15 $\mu$m or less in depth and a gate electrode as a region of reduced width of 0.1 $\mu$m or less. Fabrication of a p-channel MOS transistor is achieved by changing conductivity of each region of the n-channel MOS transistor to the opposite.

Figure 1:
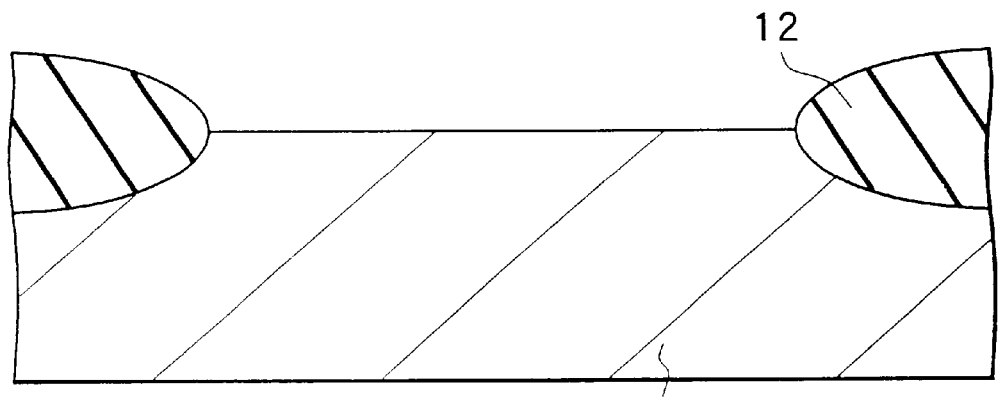
FIGS. 1(A) to 1(I) each show a cross section for illustrating a manufacturing step of an n-channel MOS transistor relating to a first embodiment of the invention.
Figure 1:
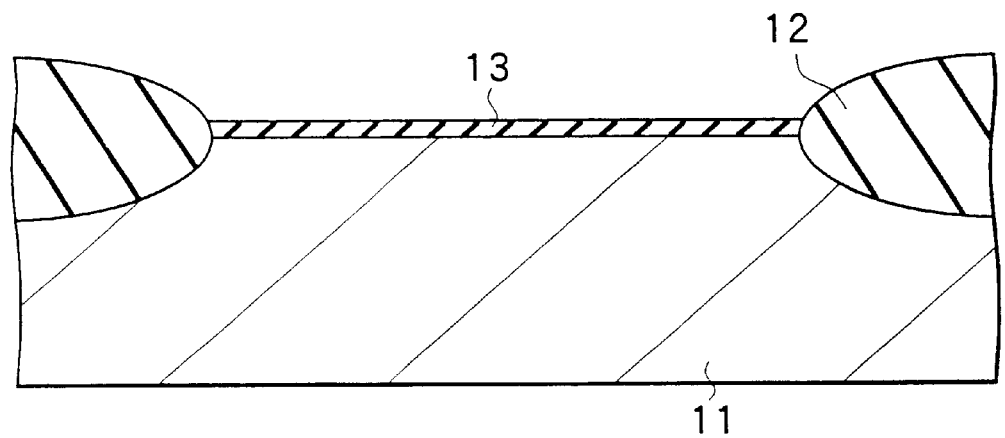
Figure 1:
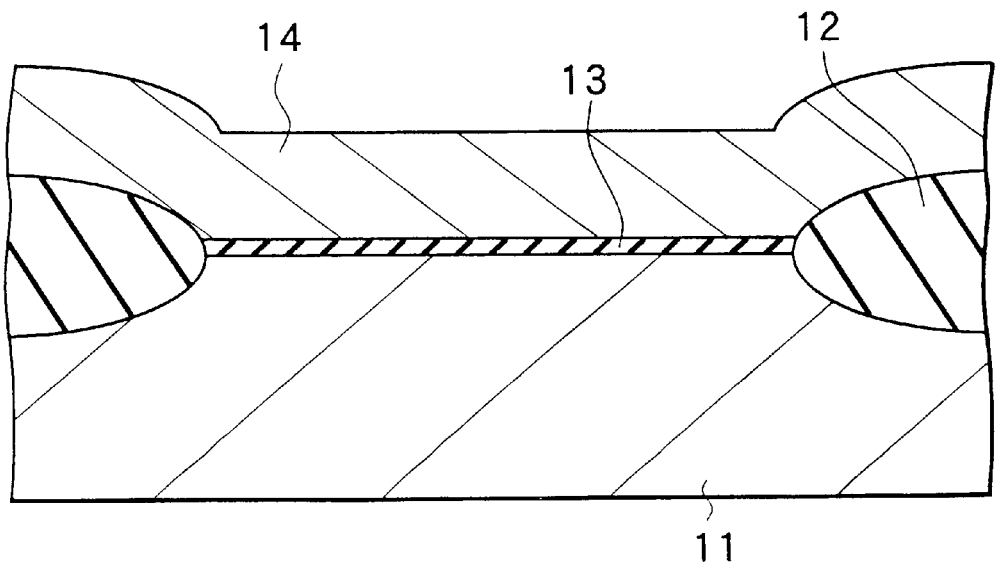
Figure 1:
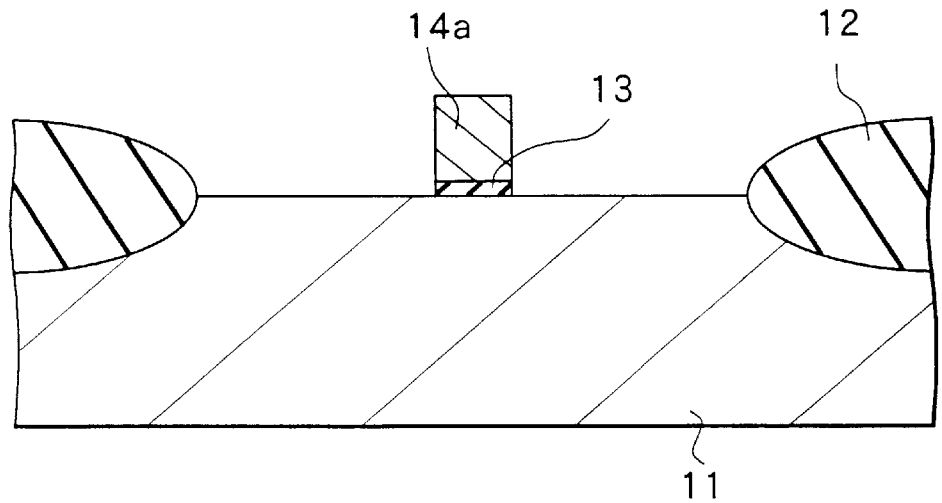
Figure 1:
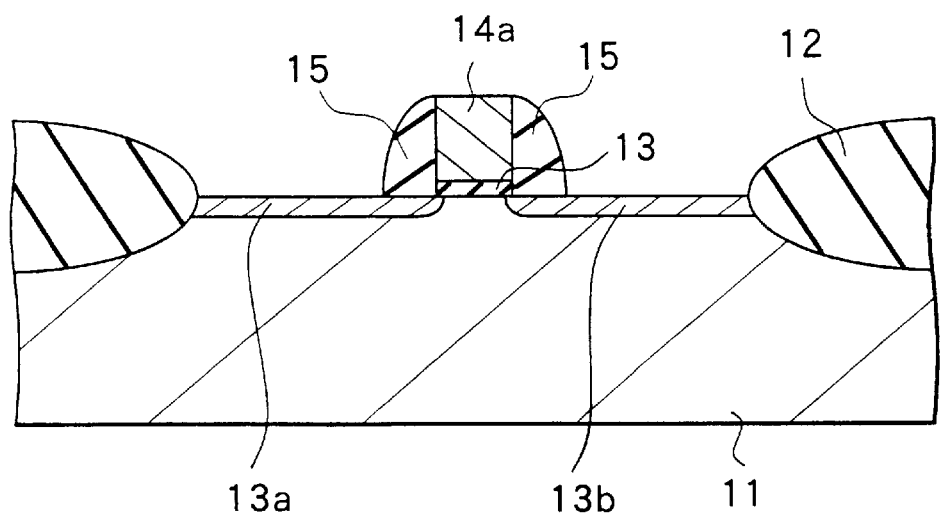
Figure 1:
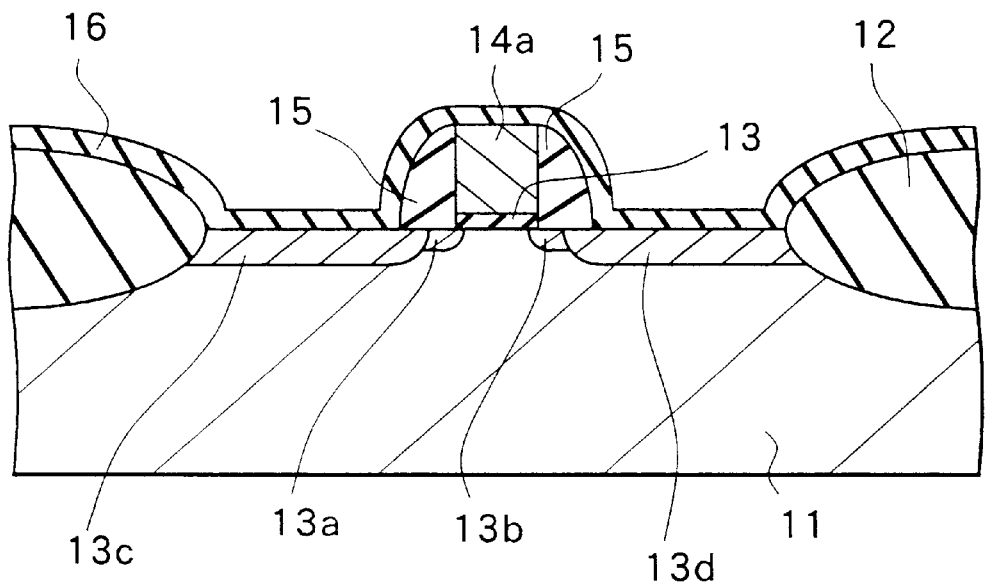

FIGS. 1(A) to 1(I) show the manufacturing method of the n-channel MOS transistor of a first embodiment of the invention in order of manufacturing steps. As shown in FIG. 1(A), a p-type silicon substrate 11 is utilized in a surface of which a device isolation film 12 of 300 nm in thickness, for example, is formed through a method such as local oxidation of silicon (LOCOS). Next, ion implantations through the silicon substrate 11 are each performed for well region formation, channel stopper region formation, deep region formation and threshold adjust, respectively. As shown in FIG. 1(B), a gate insulating film 13 of 4 nm in thickness, for example, is then formed through thermal oxidation in a region surrounded by the device isolation film 12. As shown in FIG. 1(C), a polysilicon film 14 of 200 nm in thickness, for example, is then formed through a method such as chemical vapor deposition (CVD) over the gate insulating film 13. The polysilicon film 14 will be a gate electrode as described below. Implantation of impurity ions in the polysilicon film 14 and the silicon substrate 11 allows low resistivity of the gate electrode while source and drain regions are formed. If this method results in depletion of the gate, impurities may be introduced into the polysilicon film 14 when the polysilicon film 14 is formed. Impurities to be introduced may be phosphorus (P) for an n$^+$ gate and boron (B) for a p$^+$ gate of the order of $10^{15}$.

Next, as shown in FIG. 1(D), a gate electrode 14a is fabricated by dry etching of the polysilicon film 14 to be formed into a gate through lithography. Ion implantation of n-type impurities, that is, lightly doped drain (LDD) implantation, is carried out with masking of the device isolation film 12 and the gate insulating film 14a. LDD regions 13a and 13b are thus formed as shown in FIG. 1(E). Pocket ion implantation may be added after the LDD implantation in some cases. The pocket ion implantation provides formation of a local region for suppressing a punch through in a region near the LDD regions with boron difluoride ($BF_2$) and arsenic (As) as impurities. Next, an oxide film ($SiO_2$), not shown in the figure, is formed through CVD, for example, followed by dry etching (etchback) of the whole surface of the silicon substrate 11. Sidewall insulating films 15 are thus formed with a width of 0.1 $\mu$m, for example, on sides of the gate electrode 14a. Ion implantation of n-type impurities is then performed with masking of the gate electrode 14a including the sidewall insulating films 15 and the device isolation film 12. A source region 13c and a drain region 13d are thus formed as shown in FIG. 1(F). At the same time, n-type impurities are implanted in the gate electrode 14a, too. Low resistivity of the gate electrode 14a is thus achieved. Annealing then follows for activation of the impurities implanted in the source region 13c, the drain region 13d and the gate electrode 14a. In order to form a shallow junction such that the depth of the impurity layer of the source region 13c and the drain region 13d is 0.10 to 0.15 $\mu$m, arsenic is implanted with energy of the order of 20 keV for the n-channel MOS transistor. Annealing for impurity activation is performed for 10 seconds at 1000° C. through RTP. The foregoing description of the process is similar to conventional manufacturing methods of a MOS transistor.

Figure 1G:
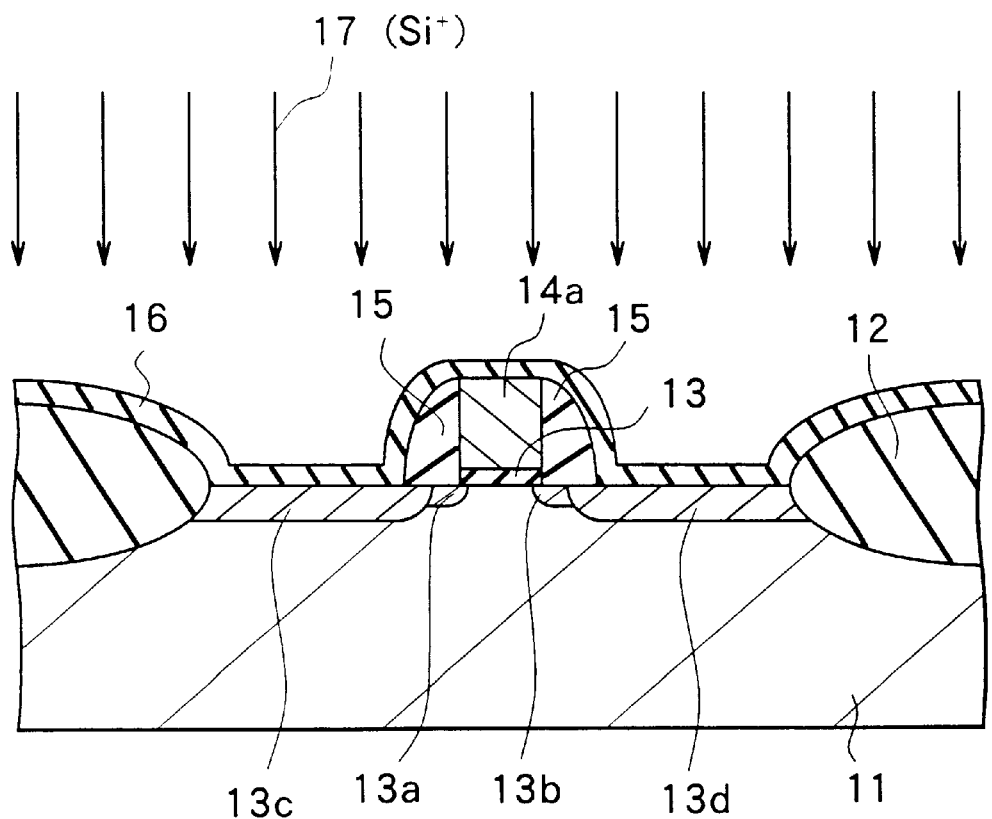
Figure 1:
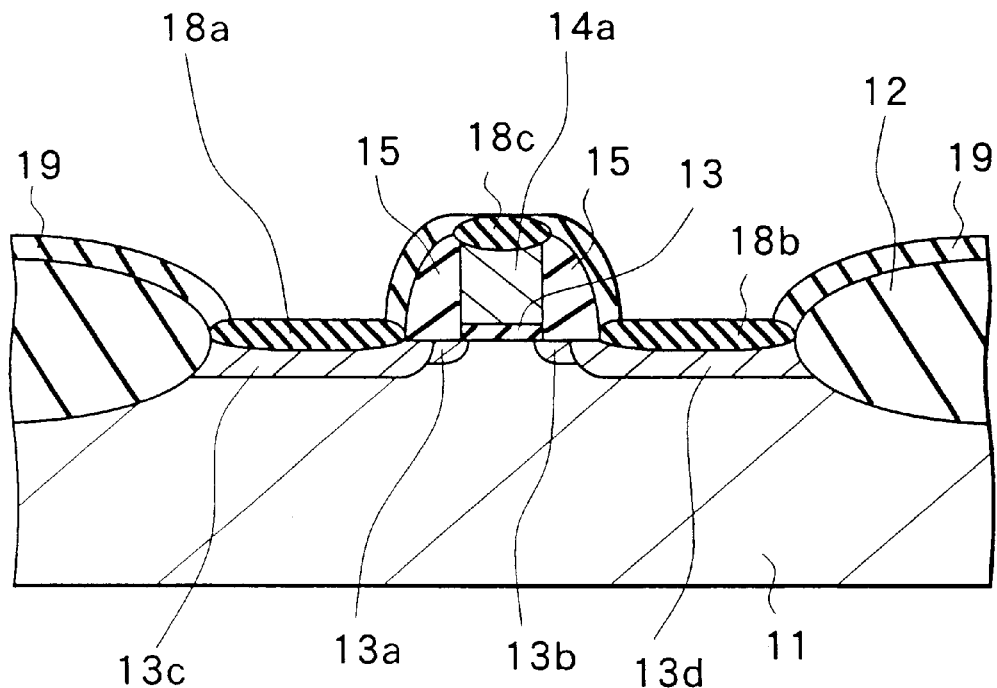
Figure 1:
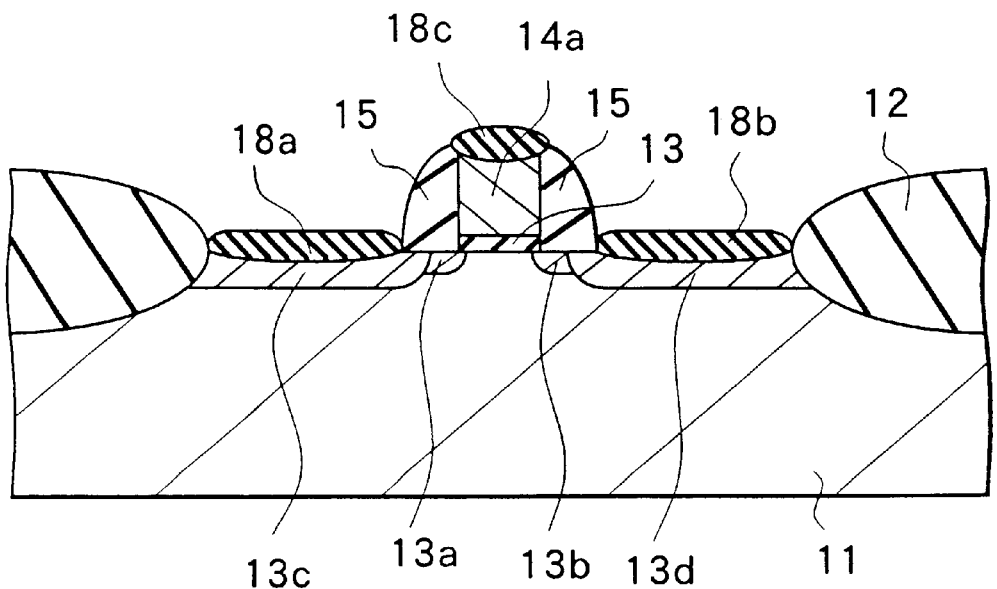

Next, a cobalt film 16 of the order of 10 nm in thickness is formed over the whole surface of the silicon substrate 11 through sputtering, for example. As shown in FIG. 1(G), silicon ions ($Si^+$) 17, for example, are implanted through the cobalt film 16. The conditions for the implantation is 10 keV of energy and $3 \times 10^{16}/cm^2$ of dose, for example. Then, the silicon ions 17 are reacted with cobalt in the source region 13c, the drain region 13d and the gate electrode 14a through an RTP (a first heat treatment) for 30 seconds at 550° C., for example. Cobalt silicide layers 18a, 18b and 18c are thus selectively formed each on the source region 13c, the drain region 13d and the gate electrode 14a, respectively, as shown in FIG. 1(H). As shown in FIG. 1(I), unreacted portions of the cobalt film 19 are selectively removed in regions except the source region 13c, the drain region 13d and the gate electrode 14a by wet etching with a sulfuric acid and hydrogen peroxide mixture.

A heat treatment (a second heat treatment) is then performed for 60 minutes at 600° C., f or example. Unreacted cobalt (Co) or cobalt silicide (CoSi) in crystal grain boundaries in the cobalt silicide layers 18a, 18b and 18c is thus reacted with silicon so as to form cobalt silicide without growing into a spike and without diffused in the substrate. The reason the second heat treatment is required will be described.

Figure 5:
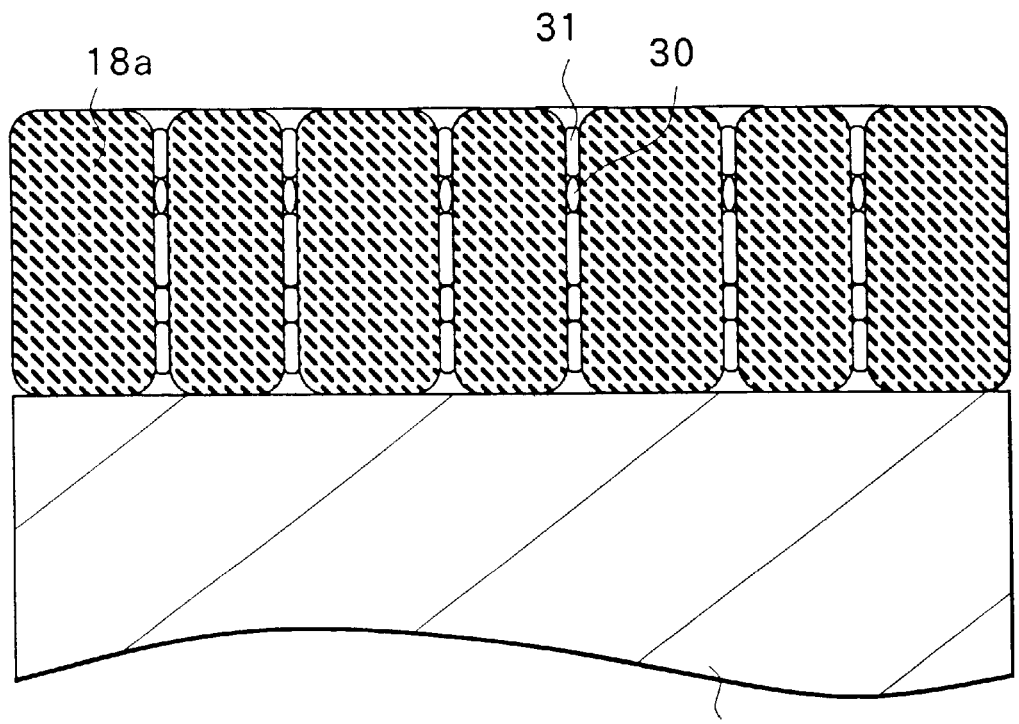
FIGS. 5(A) and 5(B) are schematics for illustrating a method of improving crystallinite in cobalt silicide in the manufacturing step shown in FIG. 1(H).
Figure 5:
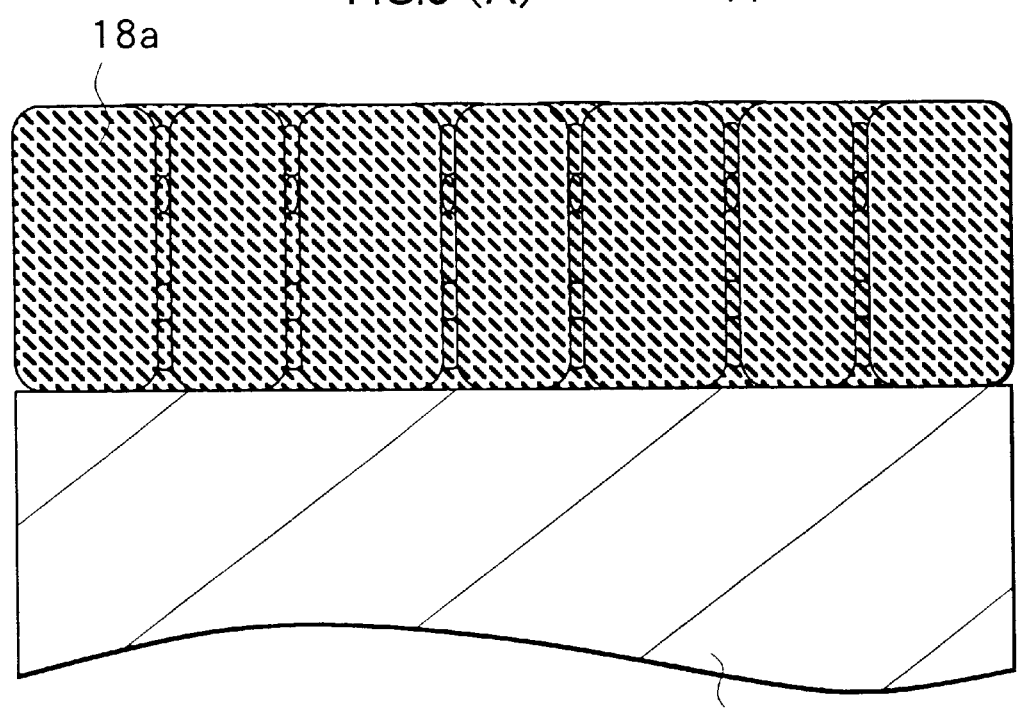

The implantation of the silicon ions ($Si^+$) 17 through the cobalt film 16 as described above allows the silicon crystal to be damaged at the cobalt/silicon interface. The crystal in the silicon substrate is damaged as well in a depth of 40 nm or less. In this state the first heat treatment is performed at 550° C., for example, so as to obtain the cobalt silicide layer of low resistivity without a nanowire effect. When a heat treatment is performed through an RTP for a short time, cobalt silicide ($CoSi_2$) will not creep up to the insulating film above. The first heat treatment after the silicon ion implantation accelrates the silicidation reaction. Consequently sheet resistance is reduced while crystallinity of the cobalt silicide to be formed is slightly reduced. That is, as shown in FIG. 5(A), the rapid growth of the cobalt silicide causes unreacted cobalt (Co) or cobalt silcide (CoSi) 31 to remain in the crystal grain boundaries 30. Therefore the present invention further provides the second heat treatment for about 60 minutes at 600° C., for example, for improving the crystallinity after the first heat treatment. This allows the unreacted cobalt or cobalt silicide remaining in the crystal grain boundaries to regrow into silicide and the unreacted cobalt or cobalt silicide disappears as shown in FIG. 5(B).

It is important to perform the second heat treatment after the first heat treatment (RTP) and further selective etching so that the unreacted cobalt over the insulating film is not reacted. It is also required that the second heat treatment is performed in a range of 400 to 700° C. for accelrating crystallization as well as avoiding the unreacted cobalt and cobalt silicon from regrowing into a spike and from being diffused in the substrate. That is, it is required to suppress junction leakage. In addition, it is preferable that the second heat treatment is performed in a range of 30 to 60 minutes for allowing the unreacted cobalt or cobalt silicide in the crystal grain boundaries to be completely reacted with the cobalt silicide and for avoiding rediffusion of the impurities implanted for fabrication of the MOS transistor.

Description is continued on FIG. 1(I). After the second heat treatment as described above, a heat treatment (a third heat treatment) at 800° C., for example, is performed. As a result, the cobalt silicide layers 18a, 18b and 18c have an even thickness. Junction leakage in the source region 13c and the drain region 13d is reduced as well.

Next, an interlayer insulator ($SiO_2$), not shown in the figure, of 100 to 800 nm in thickness, for example, is formed through a method such as CVD. Contact holes, not shown in the figure, are then formed by dry etching each in a region opposing the source region 13c and the drain region 13d. The contact holes each reach the cobalt silicide layers 18a and 18b. A layered film (TiN/Ti) of a thin film of titanium nitride (TiN) and a titanium film is selectively formed over an inner wall and a bottom of each of the contact holes, that is, a surface of each of the cobalt silicide layers 18a and 18b. The contact holes are then filled with a tungsten (W) layer. Next, a titanium film is formed over the silicon substrate 11 including the contact holes. A film of aluminous alloy such as aluminum (Al) containing silicon is further formed over the titanium film to be patterned for forming a wiring layer electrically connected to the tungsten layer.

As described so far, the present invention provides the process of forming the refractory metal silicide layer wherein the silicon ions 17 are implanted in the thin film (the cobalt film 16) of 10 nm in thickness, for example, followed by silicidation through the heat treatment. As a result, the refractory metal silicide layers (the cobalt silicide layers 18a and 18b) with low sheet resistance are formed even on the very shallow source region 13c and the drain region 13d of 0.15 $\mu$m or less. In addition, the sheet resistance does not depend on a wiring width even in a region where a wiring width is 0.1 $\mu$m or less (on the gate electrode 14a). The method of the invention is easily implemented in addition to a conventional manufacturing process of a semiconductor device without substantial cost increase.

The embodiment described above provides formation of the cobalt silicide layers 18a, 18b and 18c through the first to third heat treatments. Instead, the heat treatments may be twice without the third process. In order to form the cobalt silicide layers through one heat treatment only, the second heat treatment is only required for about 60 minutes under a temperature in a range of 400 to 700° C., such as 600° C. Furthermore, the second heat treatment process may be followed by the third heat treatment after selective etching.

Second Embodiment

A second embodiment of the invention will now be described. The same numerals are assigned to components similar to those of the first embodiment and their descriptions are omitted.

In the first embodiment, silicon ions are implanted for generating crystal damage. Ions to be implanted in the second embodiment are ionized atoms or molecules containing atoms with an enhanced diffusion suppressing effect. Atoms with an enhanced diffusion suppressing effect are fluorine atoms, for example. Fluoride ions ($F^+$) may be independently used. Silicon fluoride ions ($SiF^+$) are applicable, too. A combination of fluoride ions and silicon ions used in the first embodiment may be used.

Figure 6:
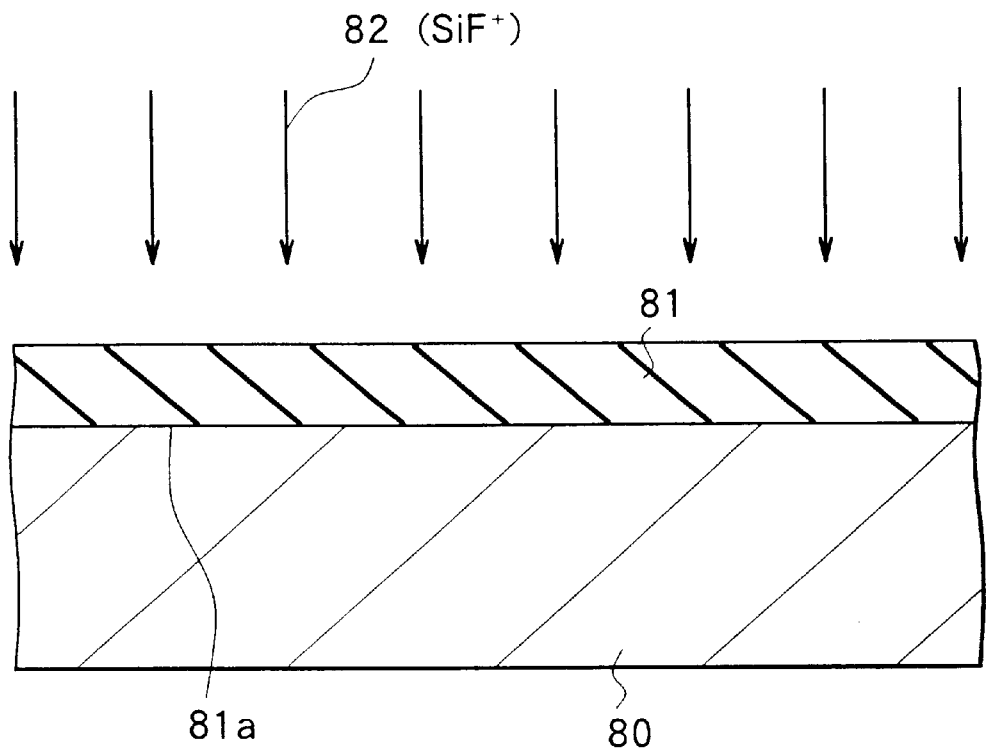
FIGS. 6(A) and 6(B) are schematics for illustrating a fundamental principle of a second embodiment of the invention.
Figure 6:
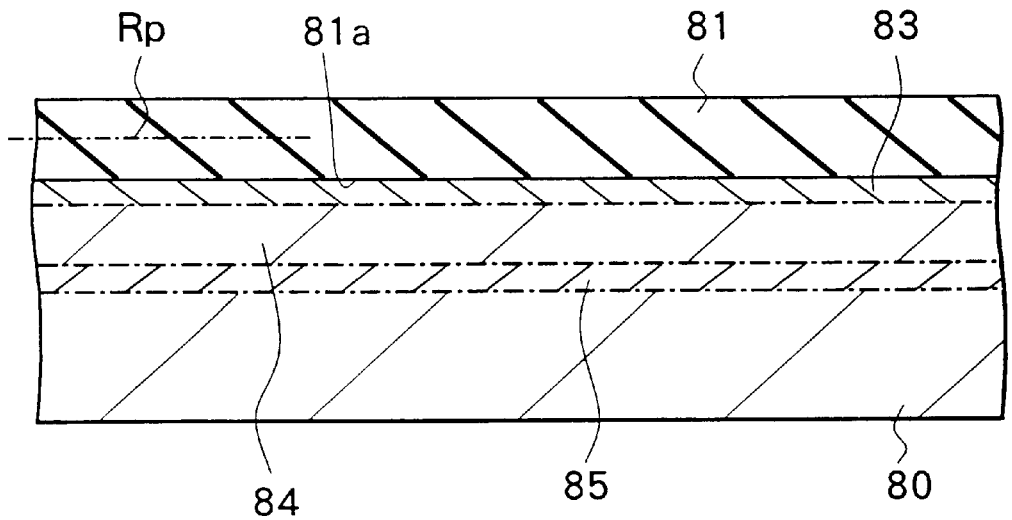

In the second embodiment, for example, a refractory metal layer is formed on a silicon substrate 80 through sputtering, for example, as shown in FIG. 6 (A). The refractory metal layer is, for example, a cobalt film 81 having a thickness of 10 nm. Ion implantation of silicon fluoride ions 82 is then performed through the cobalt film 81 with implantation energy of 17 keV and a dose of $1 \times 10^{16}/cm^2$. The ion implantation is performed such that a peak Rp of ion concentration is in the cobalt film 81. Consequently, as shown in FIG. 6(B), silicon atoms are implanted in the cobalt film 81 as well as silicon crystal is damaged at an interface between the cobalt film 81 and the silicon substrate 80 (a cobalt/silicon interface 81a). Crystal damage is effectively produced as well in the silicon substrate 80 from the cobalt/silicon interface 81a to a depth of 40 nm.

As described so far, silicon atoms are implanted in the cobalt film 81 through the implantation of the silicon fluoride ions 82 while crystal damage increases at the cobalt/silicon interface 81a. In a region 83 adjacent to the cobalt/silicon interface 81a, it is preferable that the density of at least either the vacancies or the interstitial silicon atoms is half or more of the number of the atoms per unit volume in the silicon crystal, that is, $2.5 \times 10^{22}/cm^3$. A crystal damage region 84 is formed as well in a region within 40 nm in depth from the cobalt/silicon interface 81a. When silicon fluoride ions are implanted, fluorine atoms implanted simultaneously with silicon atoms are implanted slightly deeper than the silicon atoms because the atomic weight of fluorine is slightly smaller than that of silicon. As a result, a fluorine atom implanted region 85 is formed beneath the crystal damage region 84.

As described above, crystal damage is produced at the cobalt/silicon interface 81a when the silicon fluoride ions 82 are implanted. As a result, a natural oxide film formed over the silicon substrate 80 before the formation of the cobalt film 81 is damaged as well. After the implantation of the silicon fluoride ions, a cobalt silicide layer is formed through a heat treatment at a temperature in a range of 400 to 900° C., for example, wherein the cobalt film is reacted with the region of silicon where crystal damage is produced.

As described so far, the second embodiment provides implantation of the silicon fluoride ions 82 in the cobalt film 81. The cobalt silicide layer of low resistivity without a nanowire effect is therefore formed as the first embodiment as described in FIGS. 2(A) and 2(B).

In addition, the fluorine atoms are implanted slightly deeper than the silicon atoms in the second embodiment. For example, a cobalt silicide layer is formed on an impurity region (a source and a drain) of an n-channel MOS transistor doped with boron as impurities. In this case, an enhanced diffusion of boron due to crystal damage is suppressed by fluorine atoms. That is, an interaction starts between interstitial silicon atoms and fluorine atoms before an interaction occurs between boron and interstitial silicon atoms. Consequently an enhanced diffusion of boron atoms is suppressed. Therefore an increase in a short-channel effect of threshold voltage, in particular, is avoided among properties of the MOS transistor.

Figure 7:
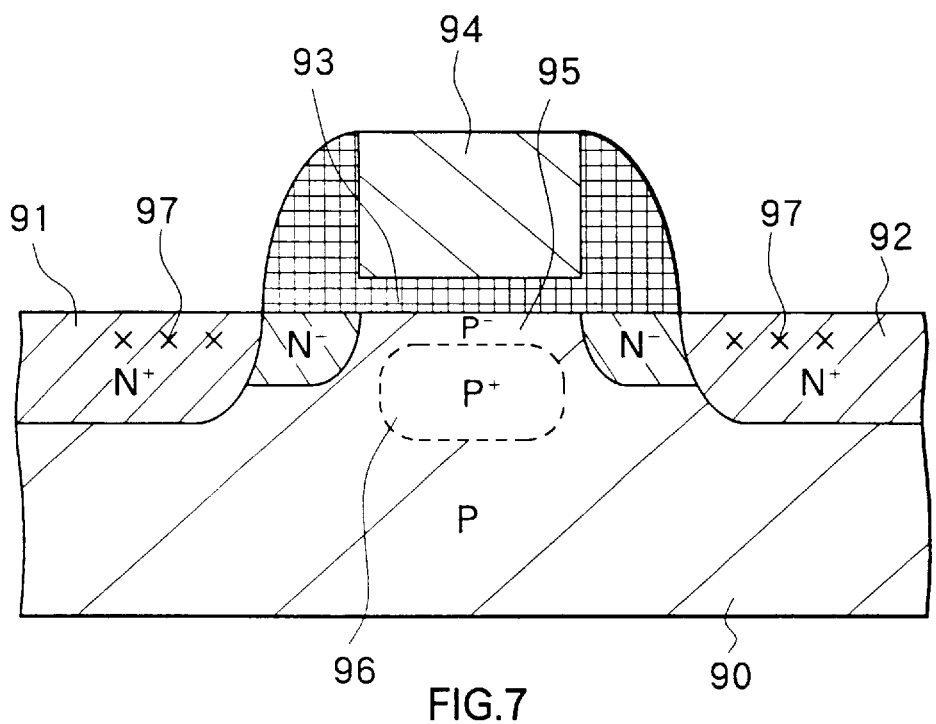
FIG. 7 is a cross section for illustrating an enhanced diffusion suppressing effect by fluorine atoms.

The embodiment will be further described in detail with reference to FIG. 7. FIG. 7 shows a structure of an n-channel MOS transistor. A source region 91 and a drain region 92 each of a LDD structure, for example, are formed in a p-type silicon substrate 90. A gate electrode 94 is formed on the silicon substrate 90 between the source region 91 and the drain region 92 with a gate insulating film 93 between the silicon substrate 92 and the gate electrode 94. If a shallow junction is formed such that a depth of the source region 91 and the drain region 92 is 0.1 to 0.15 μm in the MOS transistor, a boron doped region 96 is formed in some cases for avoiding a punchthrough due to a short-channel effect. That is, the boron doped region 96 with boron as p-type impurity may be formed beneath a channel region 95 in a surface. When a cobalt film (not shown) is formed over the source region 91 and the drain region 92 and crystal damage is produced by implantation of silicon ions only, interstitial silicon atoms generated by crystal defects 97 are diffused during heat treatment. An interaction thus starts between the interstitial silicon atoms and boron in the boron doped region 96. An enhanced diffusion of boron is then started and a concentration of boron atoms in the boron doped region 96 is reduced. In contrast, if crystal damage is produced by implantation of silicon fluoride ions and so on, an interaction starts between interstitial silicon atoms and fluorine atoms before an interaction between the interstitial silicon atoms and boron atoms because of the implanted fluorine atoms. An enhanced diffusion of boron is thus suppressed as described above. An enhanced diffusion of boron atoms is particularly frequent while an enhanced diffusion of any other atom may occur.

Figure 8:
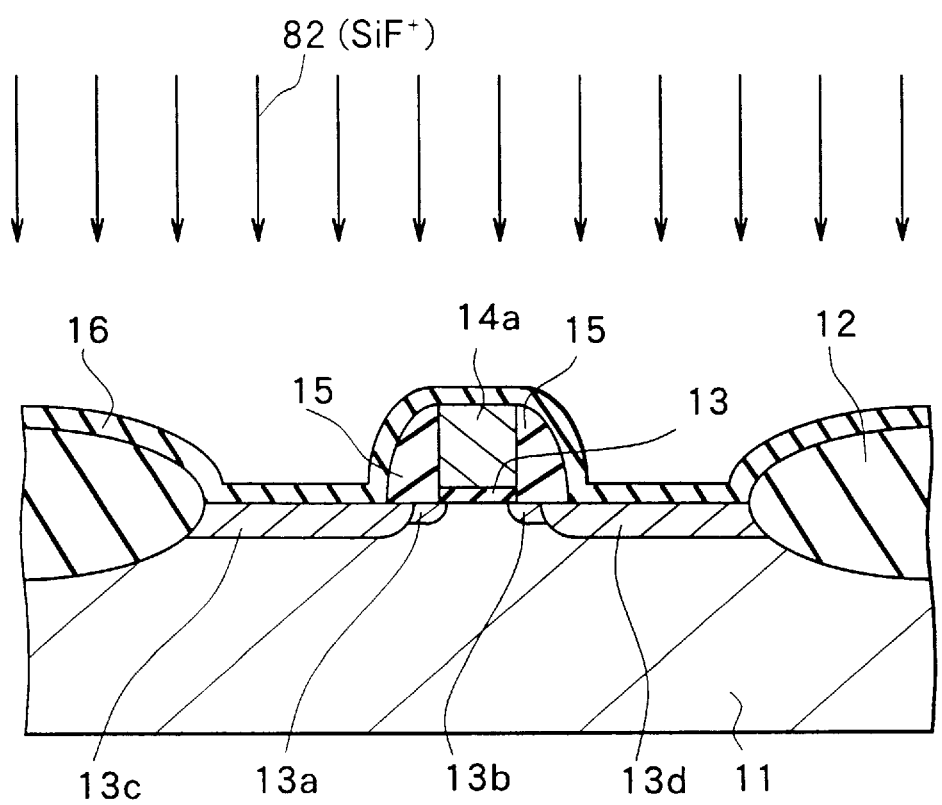
FIG. 8 is a cross section for illustrating a manufacturing step of an n-channel MOS transistor relating to the second embodiment of the invention.

A manufacturing method of an n-channel MOS transistor of the second embodiment of the invention will now be described with reference to FIG. 8. The same numerals are assigned to components similar to those of the first embodiment and their descriptions are omitted. Descriptions of similar manufacturing steps are omitted as well. The steps of the first embodiment shown in FIGS. 1(A) to 1(F) and FIGS. 1(H) and 1(I) are applicable to the second embodiment. The step shown in FIG. 1(G) is an only step different from the second embodiment.

In the second embodiment, as described with reference to FIG. 1(F), the cobalt film 16 of the order of 10 nm in thickness is formed over the whole surface of the silicon substrate 11. As shown in FIG. 8, silicon fluoride ions ($SiF^+$) 82, for example, are then implanted through the cobalt film 16. Implantation energy is 17 keV and a dose is $1 \times 10^{16}/cm^2$, for example. In a similar manner as the first embodiment, the first heat treatment is performed to selectively form the cobalt silicide layers 18a, 18b and 18c each on the source region 13c, the drain region 13d and the gate electrode 14a, respectively. Unreacted portions of the cobalt film 19 are then selectively removed in a region other than the source region 13c, the drain region 13d and the gate electrode 14a. The second and third heat treatments are then performed to make crystallinity of the cobalt silicide layers 18a, 18b and 18c more perfect. Furthermore, junction leakage is reduced in the source region 13c and the drain region 13d.

In the second embodiment, silicon fluoride ions are implanted for generating crystal damage. Implantation of fluoride ions or a combination of fluoride ions and silicon ions has a similar effect for crystal damage.

The first and second embodiments described so far provide formation of the cobalt silicide layers simultaneously on the source and drain regions and the gate electrode. Alternatively the cobalt silicide layers may be formed only on the source and drain regions or only on gate electrode. As another alternative, the cobalt silicide layers may be each formed independently on the source and drain regions and the gate electrode. These examples will now be described. Manufacturing steps different from those of the first and second embodiments will be only described.

Third Embodiment

Figure 9:
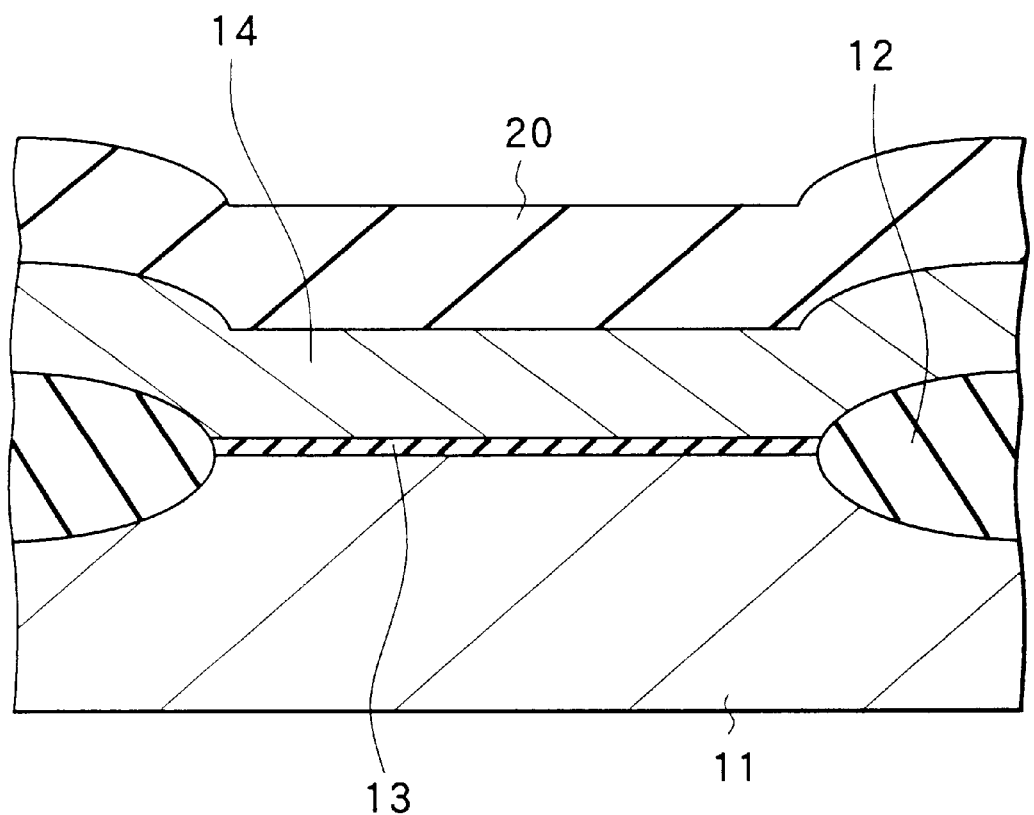
FIG. 9 is a cross section for illustrating a manufacturing step of an n-channel MOS transistor relating to a third embodiment of the invention.
Figure 10:
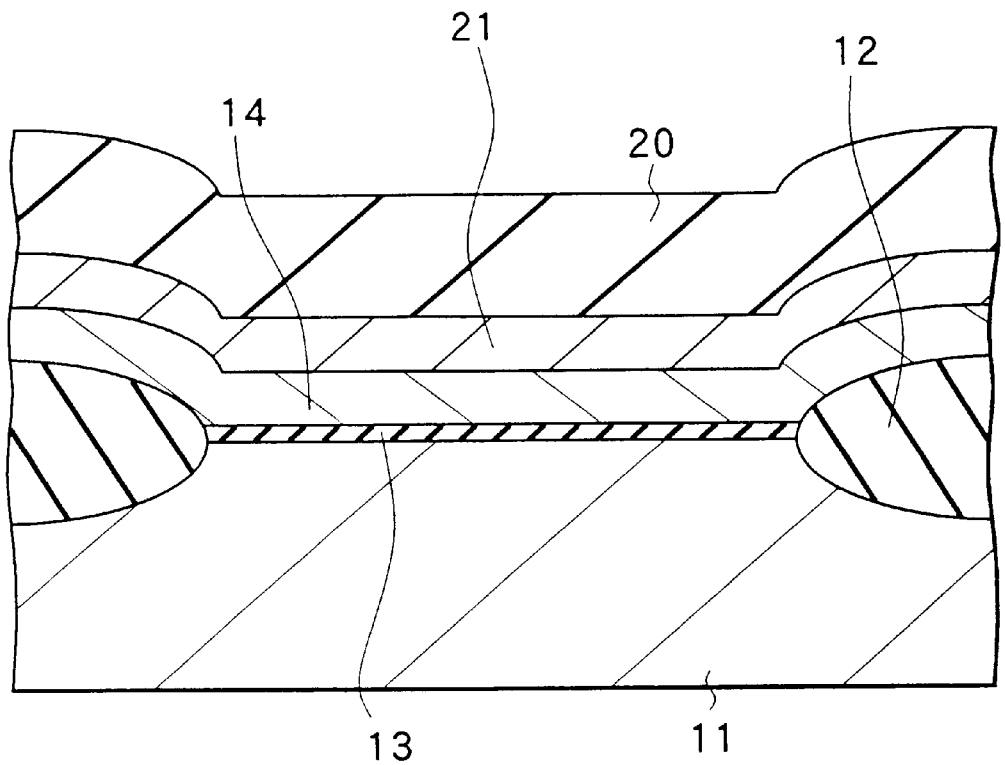
FIGS. 10(A) to 10(C) each show a cross section for illustrating a manufacturing step of an n-channel MOS transistor relating to another example of the third embodiment of the invention.
Figure 10:
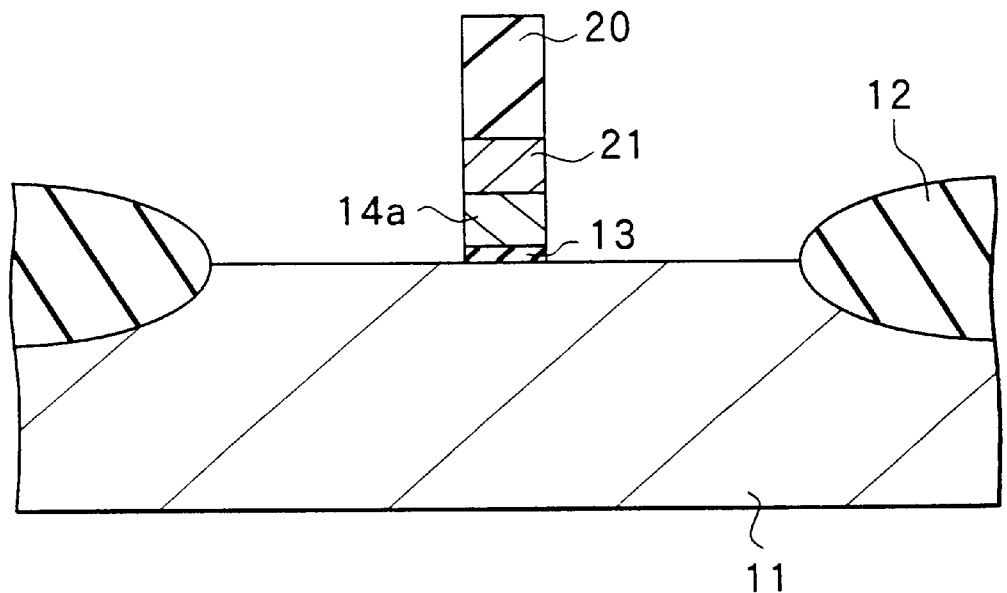
Figure 10C:
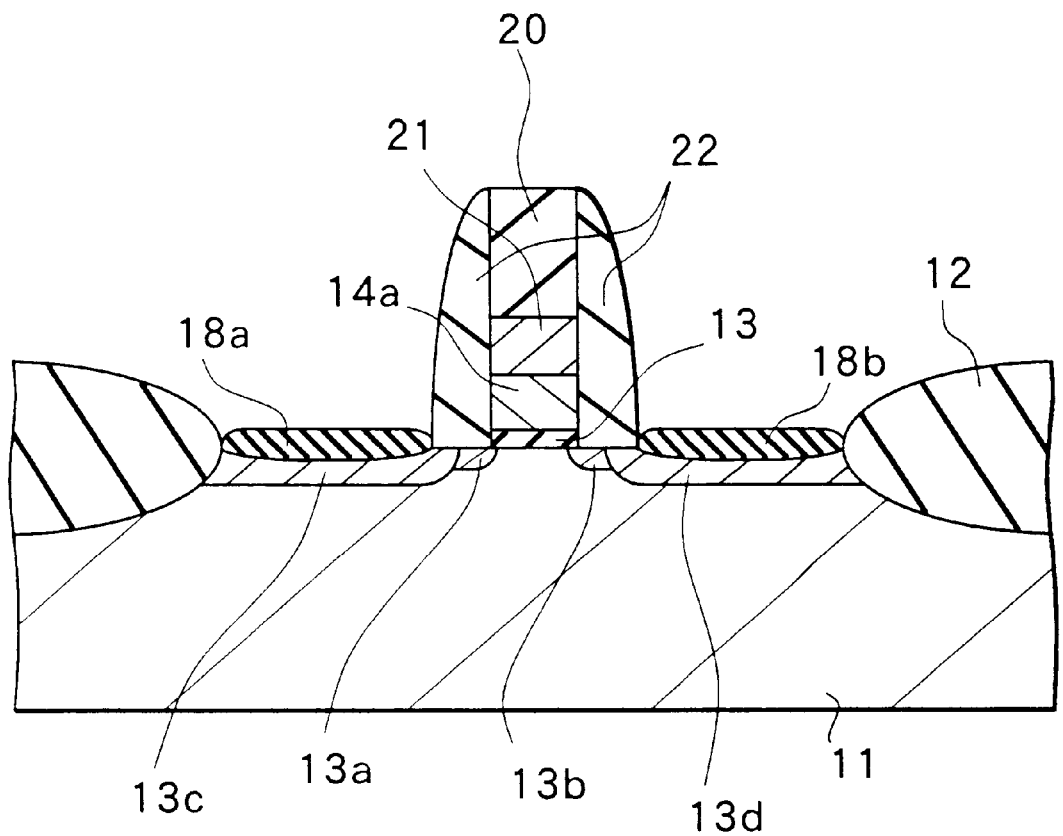

In the third embodiment formation of the cobalt silicide layers only in the source and drain regions is described. The formation of the cobalt silicide layers in the source and drain regions follows steps similar to those of the first embodiment described above. However, the cobalt silicide layers are formed after the gate electrode is covered with an insulating film so that the cobalt silicide layer is not formed over the gate electrode. That is, as described in the step shown in FIG. 1(C) of the first embodiment, the polysilicon film 14 is formed on a surface of the silicon substrate 11. An insulating film is then formed such as a silicon dioxide film 20 of 150 nm in thickness, as shown in FIG. 9, on the polysilicon film 14. If the gate electrode of low resistivity is required, a tungsten silicide (WSi$_x$) film 21 may be formed before forming the silicon dioxide film 20 as shown in FIG. 10(A). A thickness of the polysilicon film 14 is 70 nm, for example. A thickness of the tungsten silicide film 21 is 70 nm, for example. The gate electrode 14a is then formed as shown in FIG. 10(B) by etching as the first embodiment. As shown in FIG. 10(C), the sidewall insulating films 22 are further formed on sides of the gate insulating film 14a. The LDD regions 13a and 13b, the source region 13c and the drain region 13d are formed as well. After this stage the cobalt silicide layers 18a and 18b are formed through steps of cobalt film formation, ion implantation and heat treatment as the first embodiment. The cobalt silicide layer is not formed on the gate electrode 14a since the insulating film (the silicon dioxide film 20) covers the gate electrode 14a. Manufacturing steps to follow are similar to those of the first embodiment. Ions to be implanted for generating crystal damage in the third embodiment are any of silicon ions (Si$^+$), silicon fluoride ions (SiF$^+$) and fluoride ions (F$^+$) or a combination of silicon ions and fluoride ions.

As described so far, the third embodiment allows the cobalt silicide layers 18a and 18b to be formed only on the source region 13c and the drain region 13d but not to be formed on the gate electrode 14a. Therefore the embodiment is effective for an application with a gate electrode of metal is used for suppressing gate depletion.

Fourth Embodiment

Figure 11A:
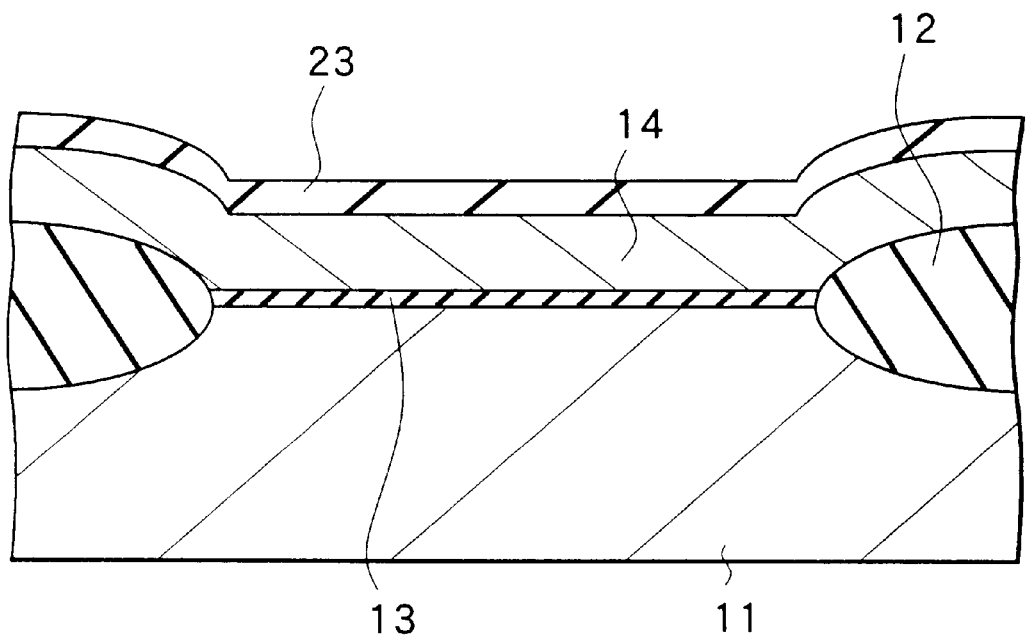
FIGS. 11(A) and 11(B) each show a cross section for illustrating a manufacturing step of an n-channel MOS transistor relating to a fourth embodiment of the invention.
Figure 11B:
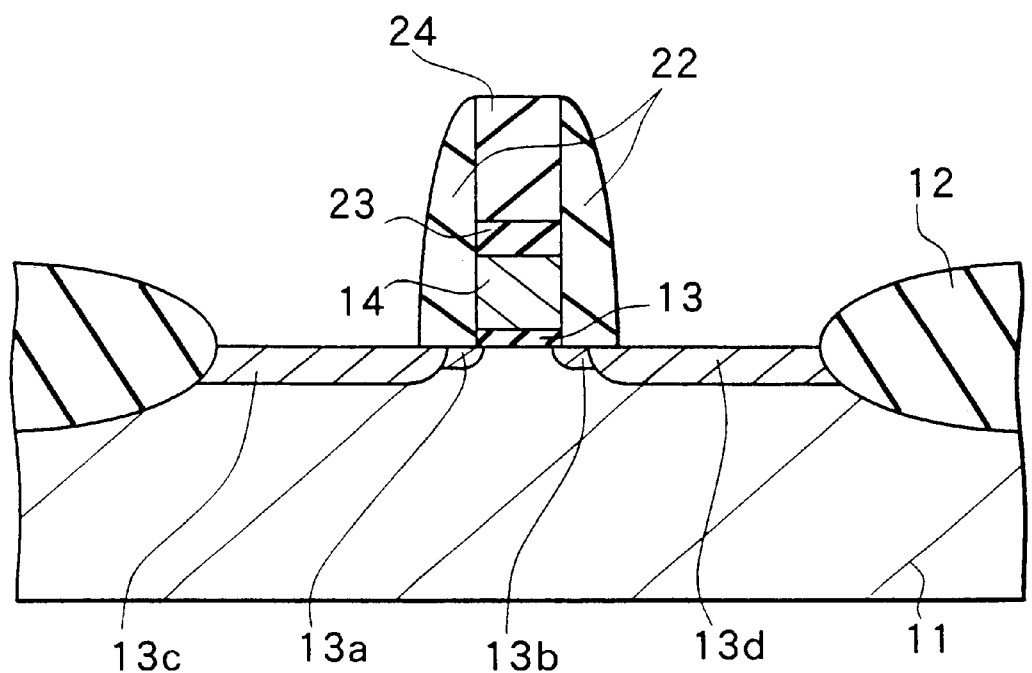

The fourth embodiment, contrast to the third embodiment, allows formation of the cobalt silicide layer only on the gate electrode 14a. The cobalt silicide layer is formed on the gate electrode 14a after formation of a polysilicon film to be the gate electrode. That is, as described in the step shown in FIG. 1(C) of the first embodiment, the polysilicon film 14 is formed on the silicon substrate 11. A cobalt film (not shown in the figure) of the order of 10 nm in thickness is then formed on the polysilicon film 14. Silicon ions, for example, are implanted through the cobalt film as the first embodiment. Next, silicon and cobalt over the polysilicon film 14 are reacted with each other through a heat treatment at a temperature of the order of 550° C., for example. A cobalt silicide layer 23 is thus formed as shown in FIG. 11(A). A silicon dioxide film 24 of 150 nm in thickness, for example, is further formed over the cobalt silicide layer 23 as shown in FIG. 11(B). The gate electrode 14a, the LDD regions 13a and 13b, the sidewall insulating films 25, the source region 13c and the drain region 13d are then formed as the first embodiment. Steps to follow are similar to those of the first embodiment.

As described so far, the fourth embodiment allows the cobalt silicide layer 23 to be formed only on the gate electrode 14a. However, the cobalt silicide layer is not formed on the source region 13c and the drain region 13d. Therefore the embodiment is effectively applied to a manufacturing process for a device such as an application specific integrated circuit (ASIC) equipped with a dynamic random access memory (DRAM) wherein a silicide film is required on a gate electrode for achieving low resistivity while a silicide film is not formed on the source and drain regions for suppressing current leakage.

Fifth Embodiment

Figure 12:
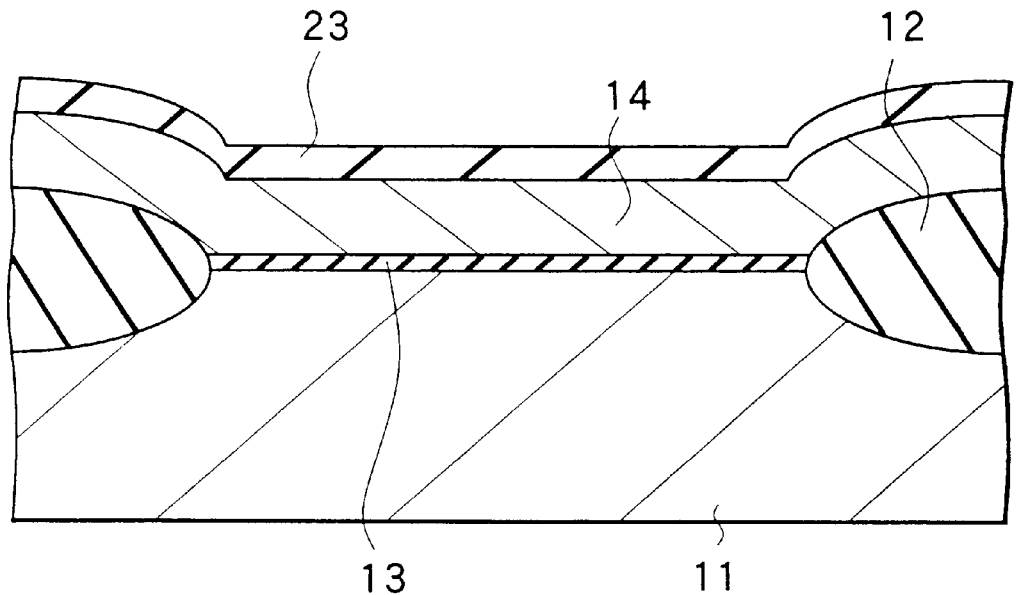
FIGS. 12(A) to 12(D) each show a cross section for illustrating a manufacturing step of an n-channel MOS transistor relating to a fifth embodiment of the invention.
Figure 12:
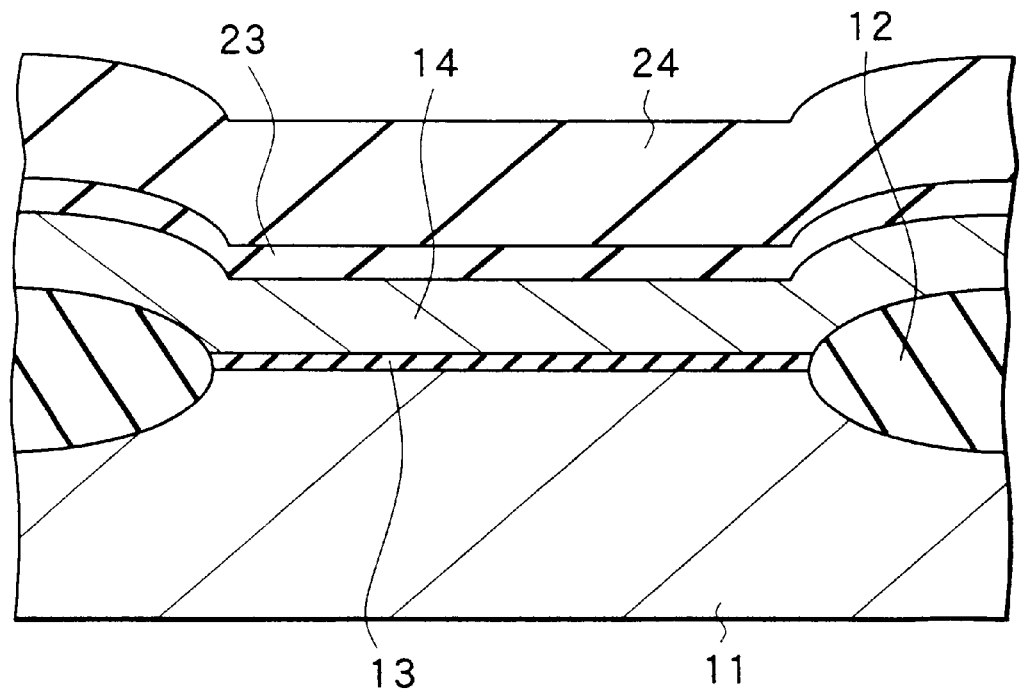
Figure 12:
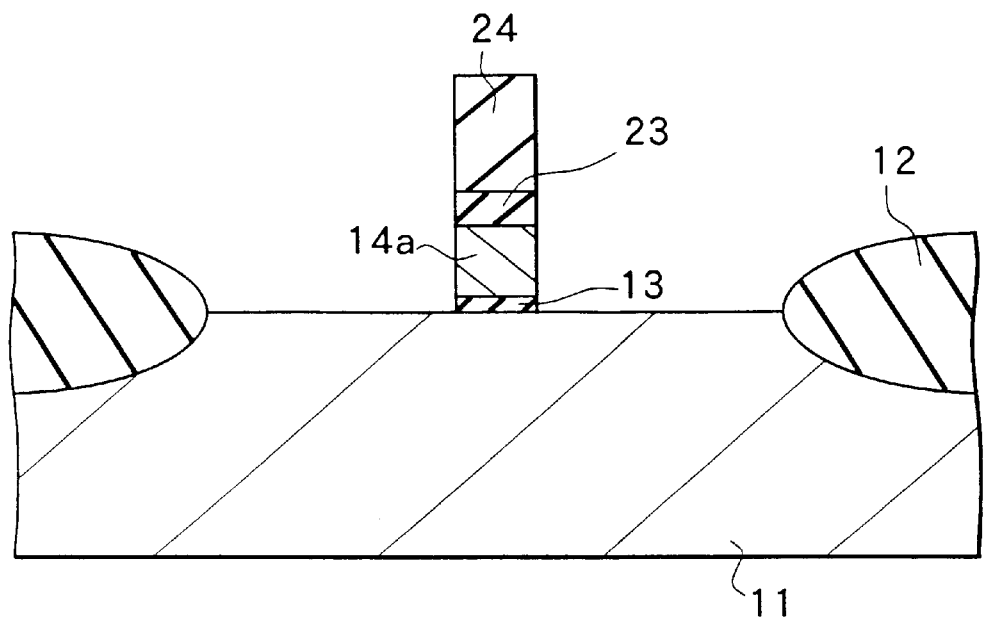
Figure 12:
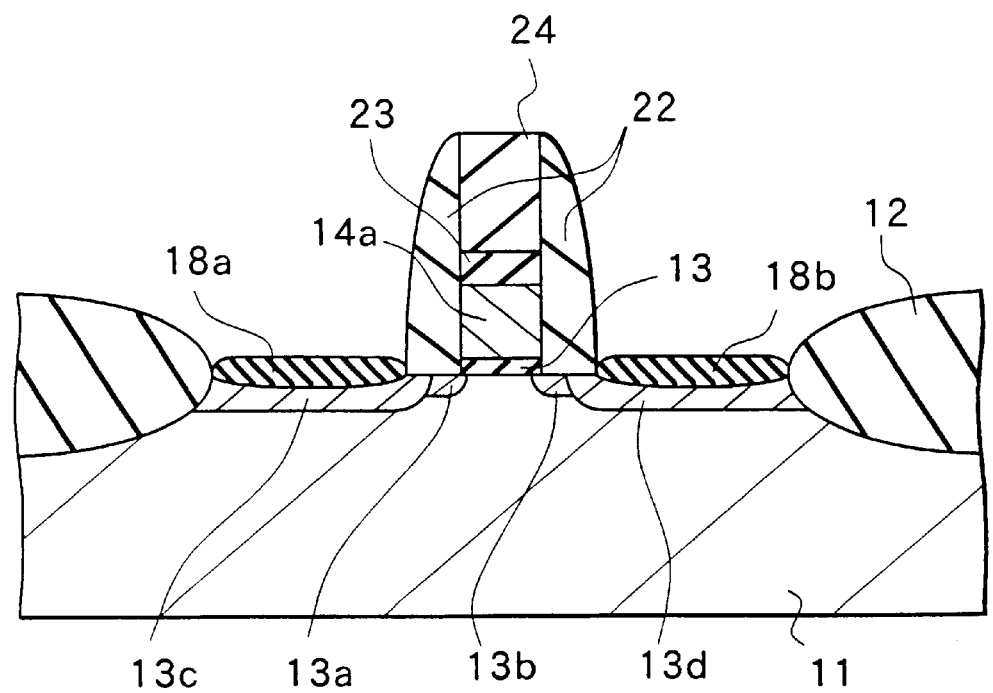

In the fifth embodiment the cobalt silicide layers are each independently formed on the gate electrode, the source region and the drain regions, respectively. The formation is implemented by a combination of the third and fourth embodiments described above. That is, as shown in FIG. 12(A), the polysilicon film 14 is formed on a surface of the silicon substrate 11. A cobalt film (not shown in the figure) of the order of 10 nm in thickness is then formed on the polysilicon film 14. Silicon ions, for example, are implanted through the cobalt film, followed by a heat treatment. The cobalt silicide layer 23 is thus formed on the gate electrode 14a. An insulating film is then formed such as the silicon dioxide film 24 of 150 nm in thickness, for example, over the polysilicon film 14 as shown in FIG. 12(B). The gate electrode 14a is then formed by etching as shown in FIG. 12(C). As shown in FIG. 12(D), the sidewall insulating films 22 are further formed on sides of the gate insulating film 14a. The LDD regions 13a and 13b, the source region 13c and the drain region 13d are formed as well. After this stage the cobalt silicide layers 18a and 18b are formed through steps of cobalt film formation, ion implantation and heat treatment.

As described so far, the fifth embodiment allows each of the cobalt silicide layers 18a, 18b and 23 to be independently formed on the source region 13c, the drain region 13d and the gate electrode 14a, respectively. Low resistivity is thus achieved in each of the regions.

Figure 13:
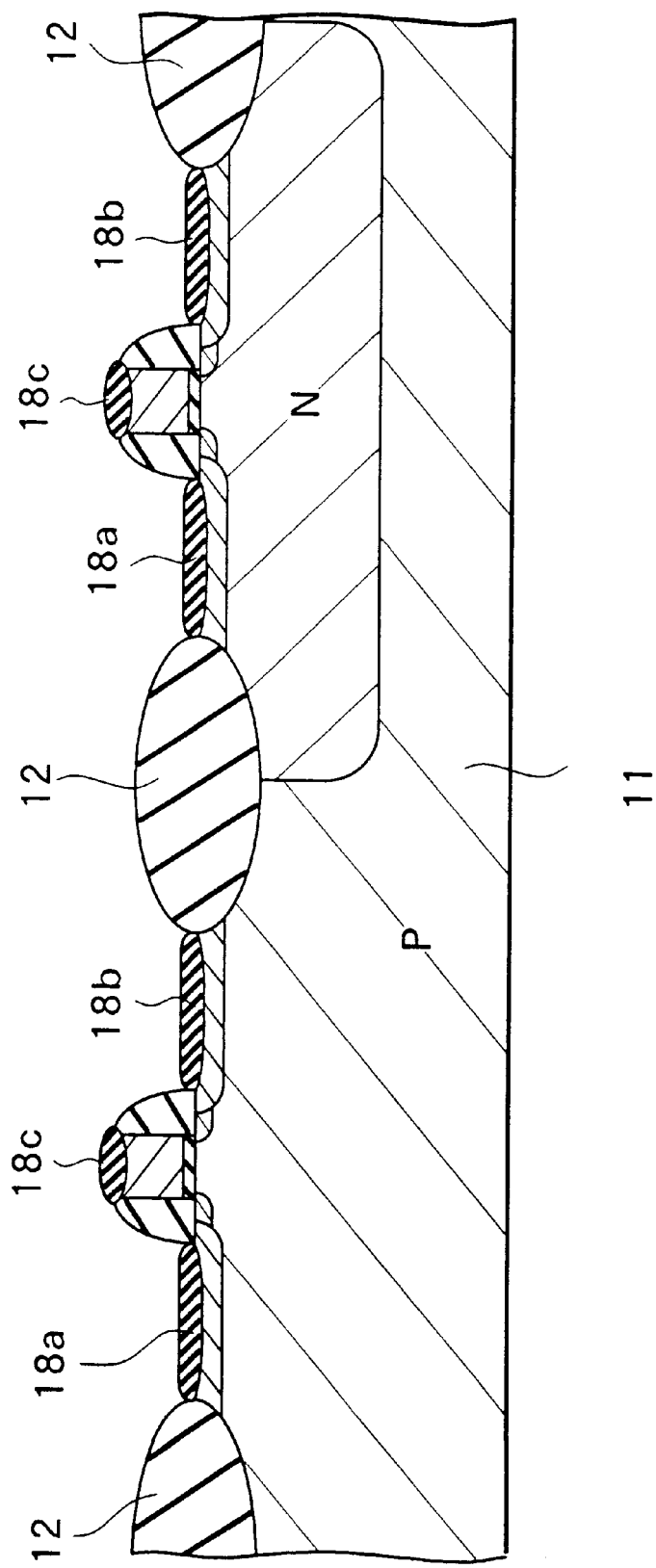
FIG. 13 is a cross section of a CMOS transistor fabricated through the first embodiment of the invention.

The present invention is not limited to the embodiments described above but may be practiced in still other ways within the scope of the invention as disclosed in the following claims. For example, the invention is not limited to the manufacturing method of an n-channel MOS transistor as described in the foregoing embodiments. The invention may be applied to a manufacturing method of a transistor having a structure of, for example, buried channel PMOS (BCPMOS), surface channel PMOS (SCPMOS), complementary MOS (CMOS) and dual gate CMOS. FIG. 13 shows an application of the invention to fabrication of a CMOS transistor. The cobalt silicide layers 18a to 18c are each formed in a gate electrode, source and drain regions of each of transistors, respectively.

The gate electrode may be made of single crystalline silicon or amorphous silicon instead of polysilicon used in the foregoing embodiments.

Furthermore, instead of cobalt used for a refractory metal, any other refractory metal is applicable such as titanium, platinum (Pt), nickel (Ni), molybdenum (Mo) and tungsten (W). Any of these metals is reacted for silicidation at a temperature in a range of 400 to 900° C. Therefore silicidation is efficiently performed in accordance with other manufacturing steps of a semiconductor device. Although the foregoing embodiments illustrate manufacturing steps of a MOS transistor, the invention may be applied to a MOS transistor ahead of subhalf-micron-generation.

According to the method of manufacturing a semiconductor device of the invention as described so far, the refractory metal film is formed in the surface of the semiconductor substrate (silicon substrate) followed by ion implantation of atoms or molecules. Crystal damage is thus produced in the region at the interface between the refractory metal film and the semiconductor substrate. As a result, the natural oxide film at the interface between the refractory metal film and the silicon substrate is satisfactorily destroyed. The refractory metal silicide with small crystal grains is thus formed. Stable growth of the refractory metal silicide is achieved over a wiring of a very small width with low resistivity.

In addition to the effect described above, ionized molecules or atoms having an enhanced diffusion suppressing effect may be implanted through the refractory metal film. Interstitial atoms are thus reacted with atoms having an enhanced diffusion suppressing effect, instead of impurity atoms prone to enhanced diffusion, such as boron. As a result, enhanced diffusion of impurity atoms is suppressed and a short-channel effect of a transistor is reduced.

Furthermore, fluorine atoms are implanted together with silicon atoms through the refractory metal film The fluorine atoms are implanted deeper than the silicon atoms due to the difference in mass of the silicon atoms and the fluorine atoms. As a result, ion implantation of the silicon atoms is achieved to be consumed for the reaction for silicidation. Enhanced diffusion of impurity atoms prone to enhanced diffusion, such as boron, is suppressed.

Ion implantation of atoms or molecules produces crystal damage such that the density of the vacancies or the interstitial atoms in a region near the interface between the refractory metal film and the silicon substrate is half or more of the number of the atoms per unit volume in the silicon crystal. As a result, a natural oxide film at the interface between the refractory metal film and the silicon substrate is damaged. The refractory metal silicide with small crystal grains is thus formed. Stable growth of the refractory metal silicide layer is thus achieved over a wiring with a width of 0.1 µm or less with low resistivity.

The sum of vacancies and interstitial atoms per unit area produced by ion implantation is equal to or greater than the amount of silicon atoms per unit area consumed for silicidation of the refractory metal film The sum of silicon atoms implanted by ion implantation and vacancies and interstitial atoms per unit area produced by the ion implantation is equal to or greater than the amount of silicon atoms per unit area consumed for silicidation of the refractory metal film. The reaction for silicidation to follow is thus completed in a short time. A reduction in thickness of the refractory metal film due to surface oxidation is suppressed. A thick refractory metal silicide layer with low sheet resistance is therefore formed without reducing the amount of refractory metal consumed for silicidation. The sheet resistance does not depend on a wiring width even in a region of small wiring width.

Impurity layers of 0.15 µm or less in depth is formed in a surface of the semiconductor substrate to be source and drain regions of a MOS transistor. Refractory metal films of 20 nm or less in thickness are each formed on the impurity layers. As a result, crystal damage in the semiconductor substrate is less than 50 nm in depth. An increase in junction leakage due to crystal defect is suppressed as well when the impurity layers are 0.15 µm or less.

Impurity layers of 0.15 µm or less in depth is formed in a surface of the semiconductor substrate to be source and drain regions of a MOS transistor. Ion implantation is performed such that a peak of concentration profile of implanted ions of atoms or molecules is in the refractory metal film. Silicon atoms are implanted in the refractory metal film and crystal damage is produced in the semiconductor substrate. As a result, silicon atoms consumed for the reaction for silicidation exist as atoms not forming a crystal. Therefore activation energy for the silicidation reaction is reduced. The reaction for silicidation is thus completed in a short time. A reduction in thickness of the refractory metal film due to surface oxidation is suppressed. A thick refractory metal silicide layer is formed without reducing the amount of refractory metal consumed for silicidation. Sheet resistance of the refractory metal silicide layer is reduced.

Furthermore, any of cobalt, titanium, nickel, platinum, molybdenum may be used as a material for the refractory metal film, which is reacted for silicidation at a temperature in a range of 400 to 900° C. Therefore silicidation is efficiently performed in accordance with other manufacturing steps of a semiconductor device.

With a heat treatment of one minute or more, unreacted refractory metal which may remain in crystal grain boundaries in the refractory metal silicide is completely reacted with silicon so as to form refractory metal silicide. The refractory metal silicide layer is thus formed with excellent crystallinity with ion implantation.

The heat treatment for forming the refractory metal silicide layer may be performed through a rapid thermal process for 30 seconds or less, followed by selective etching for removing unreacted refractory metal and then a heat treatment process for one minute or more. As a result, the refractory metal silicide layer is selectively formed in a desired place without growing over an insulating film.

The heat treatment for forming the refractory metal silicide layer may be performed at a temperature in a range of 400 to 700° C. As a result, the refractory metal silicide layer will not grow into a spike and will not be diffused in the substrate. An increase in junction leakage is thus avoided.

The heat treatment for forming the refractory metal silicide layer may be performed at a temperature in a range of 400 to 700° C., followed by selective etching for removing unreacted refractory metal and then a heat treatment process at a temperature of 800° C. or more. As a result, the refractory metal silicide layer is selectively formed in a desired place without growing over an insulating film.

What is claimed is:

1. A method of manufacturing a semiconductor device with a silicide layer, including steps of:

forming a refractory metal film of a thickness ≦20 nm on a surface of a semiconductor substrate made of silicon;

producing crystal damage in a region adjacent to an interface between said refractory metal film and said semiconductor substrate by ion implantation of atoms or molecules through said refractory metal film;

forming a refractory metal silicide layer through a first heat treatment for silicidation of said refractory metal film, said first heat treatment being a rapid thermal process at a temperature range of 400° C. to 700° C. for 30 seconds or less; then removing unreacted refractory metal film; and then performing a second heat treatment at a temperature of 400° C. to 700° C. and for more than a minute.

2. A method of manufacturing a semiconductor device with a silicide layer according to claim 1 wherein silicon ions (Si$^+$) are used for said ion implantation.

3. A method of manufacturing a semiconductor device with a silicide layer according to claim 1 wherein ions used for said ion implantation are ions of ionized atoms having an effect of suppressing enhanced diffusion or ionized molecules containing atoms having an effect of suppressing enhanced diffusion.

4. A method of manufacturing a semiconductor device with a silicide layer according to claim 3 wherein silicon fluoride ions (SiF$^+$) are used for said ion implantation.

5. A method of manufacturing a semiconductor device with a silicide layer according to claim 3 wherein silicon ions (Si$^+$) and silicon fluoride ions (SiF$^+$) are used for said ion implantation.

6. A method of manufacturing a semiconductor device with a silicide layer according to claim 3 wherein fluoride ions (F$^+$) are used for said ion implantation.

7. A method of manufacturing a semiconductor device with a silicide layer according to claim 1 wherein crystal damage is produced by ion implantation of atoms or molecules such that a density of vacancies or interstitial atoms in said region adjacent to the interface between said refractory metal film and said semiconductor substrate is half or more of atoms in a silicon crystal per unit volume.

8. A method of manufacturing a semiconductor device with a silicide layer according to claim 1 wherein crystal damage is produced by ion implantation of atoms or molecules such that bonds of silicon atoms are all detached in said region adjacent to the interface between said refractory metal film and said semiconductor substrate.

9. A method of manufacturing a semiconductor device with a silicide layer according to claim 1 wherein a sum of vacancies and interstitial atoms per unit area produced by ion implantation is equal to or greater than an amount of silicon atoms per unit area consumed for silicidation of said refractory metal film.

10. A method of manufacturing a semiconductor device with a silicide layer according to claim 2 wherein a sum of silicon atoms implanted by ion implantation and vacancies and interstitial atoms per unit area produced by the ion implantation is equal to or greater than an amount of silicon atoms per unit area consumed for silicidation of said refractory metal film.

11. A method of manufacturing a semiconductor device with a silicide layer according to claim 1 wherein said refractory metal film is formed after forming a MOS transistor having a source region, a drain region and a gate electrode in a surface of said semiconductor substrate or after processing a surface of said semiconductor substrate in order to form said MOS transistor.

12. A method of manufacturing a semiconductor device with a silicide layer according to claim 11 wherein a depth of impurity layers to be said source region and said drain region of said MOS transistor formed in the surface of said semiconductor substrate is 0.15 µm or less and a refractory metal film of 20 nm or less in thickness is formed on said impurity layer.

13. A method of manufacturing a semiconductor device with a silicide layer according to claim 11 wherein a depth of impurity layers to be said source region and said drain region of said MOS transistor formed in the surface of said semiconductor substrate is 0.15 µm or less and ion implantation energy is controlled to be N keV or less when an atomic weight or a molecular weight of atoms or molecules to be implanted is N.

14. A method of manufacturing a semiconductor device with a silicide layer according to claim 11 wherein a depth of impurity layers to be said source region and said drain region of said MOS transistor formed in the surface of said semiconductor substrate is 0.15 µm or less and ion implantation energy is controlled such that a peak Rp of concentration profile of implanted atoms or molecules is located in said refractory metal film.

15. A method of manufacturing a semiconductor device with a silicide layer according to claim 11 wherein a depth of impurity layers to be said source region and said drain region of said MOS transistor formed in the surface of said semiconductor substrate is 0.15 µm or less and a dose of atoms or molecules to be implanted is $1\times10^{16}$/cm$^2$ or more.

16. A method of manufacturing a semiconductor device with a silicide layer according to claim 11 wherein a refractory metal silicide layer is formed on each of impurity layers to be said source region and said drain region of said MOS transistor.

17. A method of manufacturing a semiconductor device with a silicide layer according to claim 11 wherein said gate electrode of said MOS transistor is made of any of polysilicon, single crystalline silicon and amorphous silicon and a refractory metal silicide layer is formed on said gate electrode.

18. A method of manufacturing a semiconductor device with a silicide layer according to claim 11 wherein said gate electrode of said MOS transistor is made of any of polysilicon, single crystalline silicon and amorphous silicon and a refractory metal silicide layer is formed on each of said gate electrode and impurity layers to be said source region and said drain region.

19. A method of manufacturing a semiconductor device with a silicide layer according to claim 18 wherein a refractory metal silicide layer is simultaneously formed on each of said gate electrode and impurity layers to be said source region and said drain region.

20. A method of manufacturing a semiconductor device with a silicide layer according to claim 11 wherein said gate electrode of said MOS transistor is made of any of polysilicon, single crystalline silicon and amorphous silicon; and impurities doped into said gate electrode and impurities of said source region and said drain region are of one conductivity type.

21. A method of manufacturing a semiconductor device with a silicide layer according to claim 11 wherein MOS transistors formed on said semiconductor substrate are both n-channel transistor and p-channel transistor.

22. A method of manufacturing a semiconductor device with a silicide layer according to claim 11 wherein a gate length of said MOS transistor is 0.3 µm or less and a depth of impurity layers to be said source region and said drain region of said MOS transistor formed in the surface of said semiconductor substrate is 0.15 µm or less.

23. A method of manufacturing a semiconductor device with a silicide layer according to claim 1 wherein a material for said refractory metal film is any of cobalt (Co), titanium (Ti), nickel (Ni), platinum (Pt), molybdenum (Mo) and tungsten (W).

* * * * *